United States Patent
Nakazawa et al.

(10) Patent No.: US 11,538,536 B2
(45) Date of Patent: Dec. 27, 2022

(54) SEMICONDUCTOR MEMORY DEVICE HAVING INSULATING LAYERS DISPOSED BETWEEN A PLURALITY OF MEMORY STRING STRUCTURES

(71) Applicant: Kioxia Corporation, Tokyo (JP)

(72) Inventors: Shingo Nakazawa, Kamakura (JP); Takashi Maeda, Kamakura (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/199,718

(22) Filed: Mar. 12, 2021

(65) Prior Publication Data
US 2022/0084608 A1 Mar. 17, 2022

(30) Foreign Application Priority Data

Sep. 15, 2020 (JP) .............................. JP2020-154336

(51) Int. Cl.
*G11C 16/34* (2006.01)
*G11C 16/30* (2006.01)
*G11C 16/26* (2006.01)
*G11C 16/14* (2006.01)

(52) U.S. Cl.
CPC .......... *G11C 16/3459* (2013.01); *G11C 16/14* (2013.01); *G11C 16/26* (2013.01); *G11C 16/30* (2013.01); *G11C 16/344* (2013.01)

(58) Field of Classification Search
CPC ..... G11C 16/3459; G11C 16/14; G11C 16/26; G11C 16/30; G11C 16/344
See application file for complete search history.

(56) References Cited

U.S. PATENT DOCUMENTS

| | | | |
|---|---|---|---|
| 7,173,862 B2 | 2/2007 | Futatsuyama et al. |
| 9,595,336 B2 | 3/2017 | Rhie |
| 10,236,254 B1 | 3/2019 | Arai et al. |
| 10,354,737 B2 | 7/2019 | Hu |
| 10,431,313 B2 | 10/2019 | Zhang et al. |

(Continued)

FOREIGN PATENT DOCUMENTS

JP 2019-54182 A 4/2019

OTHER PUBLICATIONS

Lue et al., "A Novel Double-Density Hemi-Cylindrical (HC) Structure to Produce More than Double Memory Density Enhancement for 3D NAND Flash", IEDM, IEEE, 2019, 4 pages.

(Continued)

*Primary Examiner* — Alfredo Bermudez Lozada
(74) *Attorney, Agent, or Firm* — Oblon, McClelland, Maier & Neustadt, L.L.P.

(57) ABSTRACT

A semiconductor memory device includes first conductive layers arranged in a first direction, second conductive layers arranged in the first direction, a first semiconductor layer disposed therebetween, a charge storage layer, a first wiring electrically connected to the first semiconductor layer, and first and second transistors connected to the first and the second conductive layers. In the semiconductor memory device, in an erase operation, a first voltage is supplied to at least a part of the first conductive layers, an erase voltage larger than the first voltage is supplied to the first wiring, and a first signal voltage is supplied to at least a part of the second transistors. The first signal voltage turns OFF the second transistor.

17 Claims, 27 Drawing Sheets

(56) References Cited

U.S. PATENT DOCUMENTS

| | | |
|---|---|---|
| 10,712,954 B2 | 7/2020 | Kim |
| 2016/0099063 A1* | 4/2016 | Shim .................. G11C 16/3445 |
| | | 365/185.29 |
| 2020/0126622 A1* | 4/2020 | Utsumi ............. H01L 27/11582 |

OTHER PUBLICATIONS

Du et al., "An Extremely Scaled Hemi-Cylindrical (Hc) 3D NAND Device with Large Vt Memory Window(>10V) and Excellent 100K Endurance", 2020 IEEE Symposium on VLSI Technology Digest of Technical Papers—TM1.1, 2020, 2 pages.

Hsu et al., "A Comprehensive Study of Double-Density Hemi-Cylindrical (HC) 3-D NAND Flash" IEEE Transactions on Electron Devices, vol. 67, No. 12, Dec. 2020, 6 pages.

\* cited by examiner

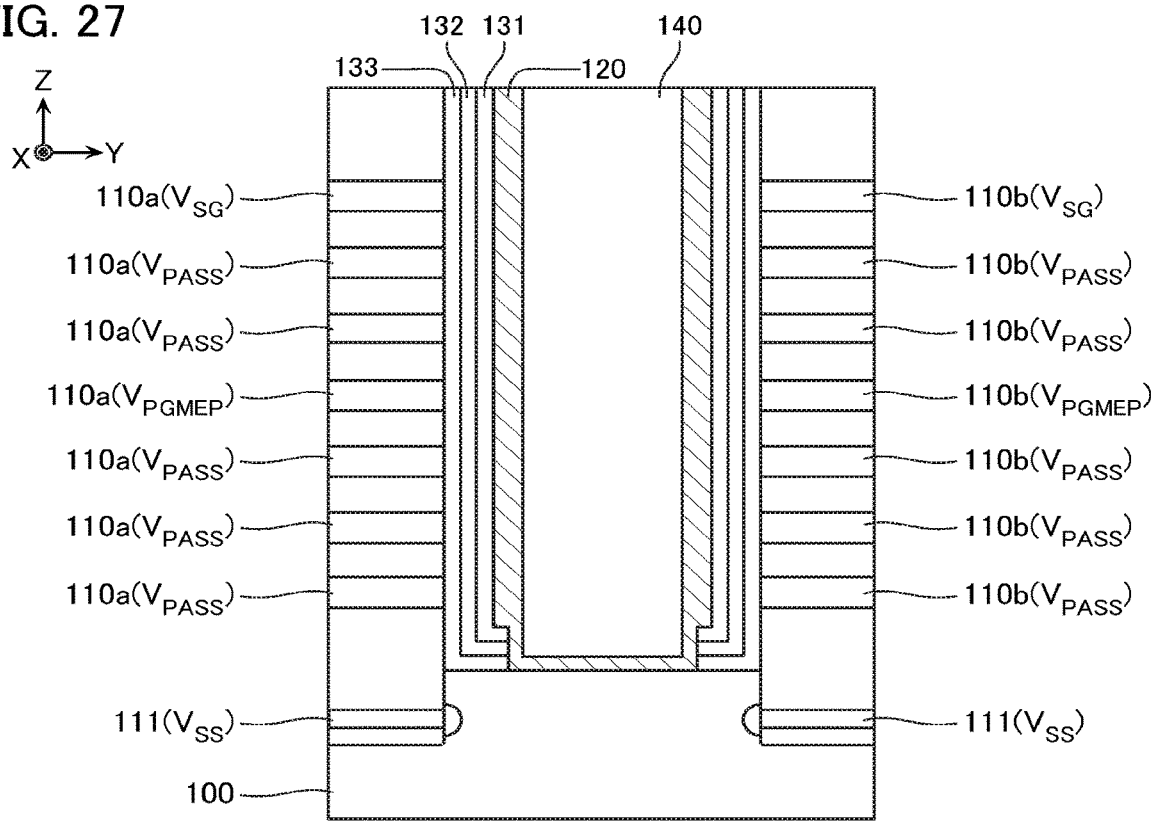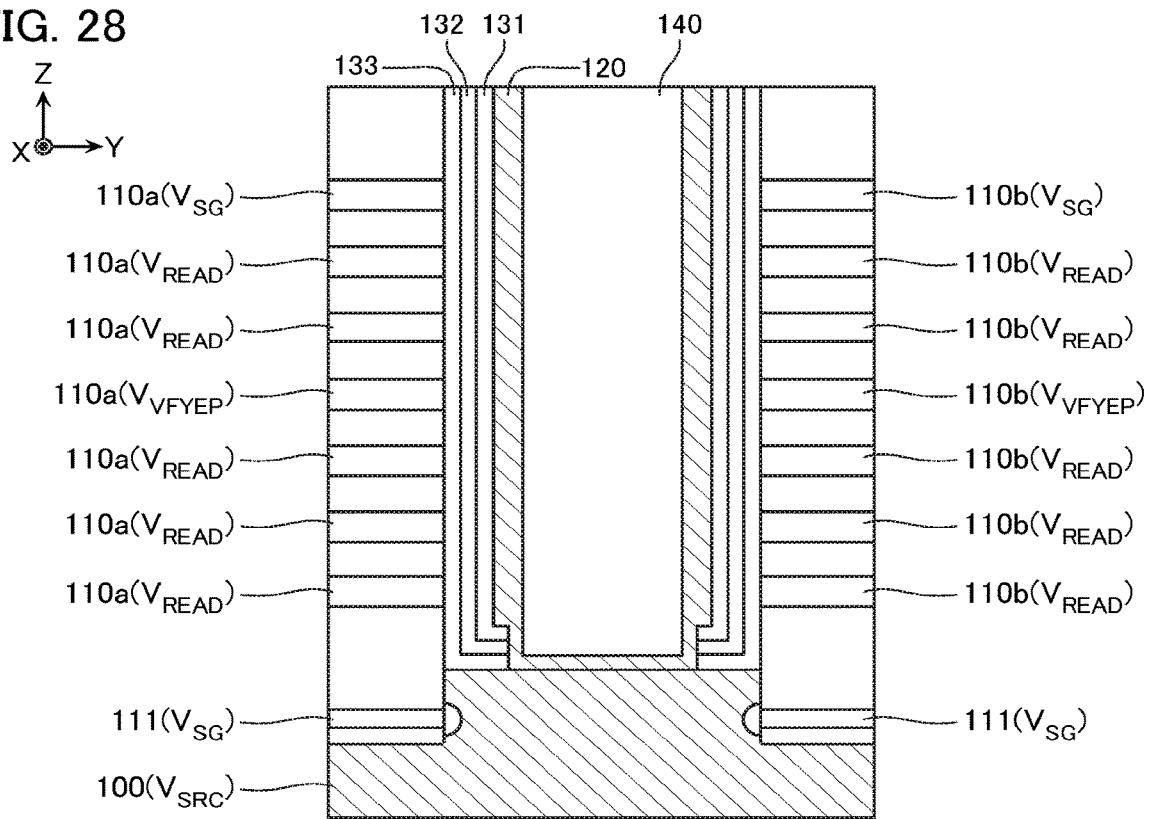

SEMICONDUCTOR MEMORY DEVICE HAVING INSULATING LAYERS DISPOSED BETWEEN A PLURALITY OF MEMORY STRING STRUCTURES

CROSS-REFERENCE TO RELATED APPLICATIONS

This application is based upon and claims the benefit of Japanese Patent Application No. 2020-154336, filed on Sep. 15, 2020, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of gate electrodes, a semiconductor layer, and a gate insulating layer. The plurality of gate electrodes are stacked in a direction intersecting with a surface of the substrate. The semiconductor layer is opposed to the plurality of gate electrodes. The gate insulating layer is disposed between the gate electrodes and the semiconductor layer. The gate insulating layer includes a memory unit configured to store data. The memory unit is, for example, an insulative charge storage layer of silicon nitride ($Si_3N_4$) or the like or a conductive charge storage layer, such as a floating gate.

BRIEF DESCRIPTION OF THE DRAWINGS

FIG. 27 is a schematic cross-sectional view for describing the double-sided EP write sequence of the semiconductor memory device according to the third comparative example;

FIG. 28 is a schematic cross-sectional view for describing the double-sided EP write sequence of the semiconductor memory device according to the third comparative example;

DETAILED DESCRIPTION

Figure 1:
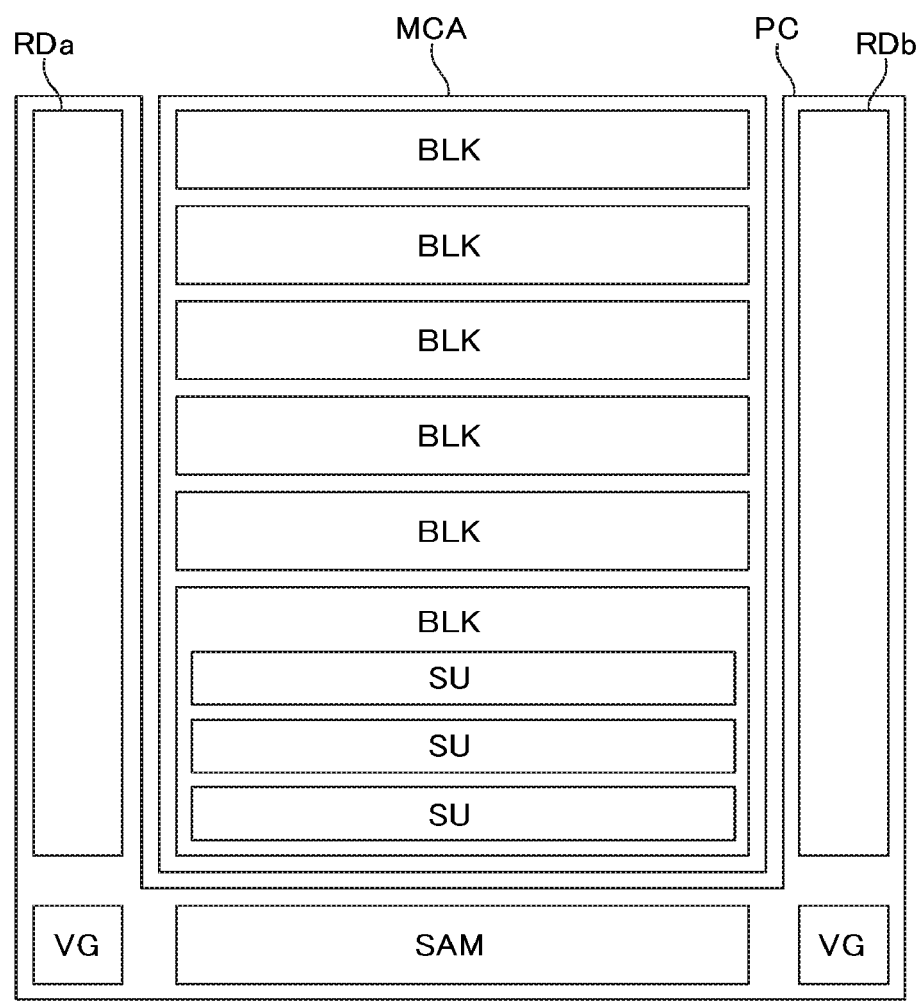
FIG. 1 is a schematic block diagram illustrating a semiconductor memory device according to a first embodiment.

A semiconductor memory device includes: a plurality of first conductive layers arranged in a first direction; a plurality of second conductive layers spaced from the plurality of first conductive layers in a second direction intersecting with the first direction, the plurality of second conductive layers being arranged in the first direction; a first semiconductor layer disposed between the plurality of first conductive layers and the plurality of second conductive layers, the first semiconductor layer extending in the first direction and opposing the plurality of first conductive layers and the plurality of second conductive layers; a charge storage layer that includes a first part and a second part, the first part being disposed between the plurality of first conductive layers and the first semiconductor layer, and the second part being disposed between the plurality of second conductive layers and the first semiconductor layer; a first wiring electrically connected to the first semiconductor layer; a plurality of voltage supply lines that supplies a voltage to at least one side of the plurality of first conductive layers or the plurality of second conductive layers; a plurality of first current paths disposed between the plurality of first conductive layers and the plurality of voltage supply lines, the plurality of first current paths each including a first transistor; and a plurality of second current paths disposed between the plurality of second conductive layers and the plurality of voltage supply lines, the plurality of second current paths each including a second transistor. The semiconductor memory device is configured to execute a first erase operation that supplies a first voltage to at least apart of the plurality of first conductive layers, supplies an erase voltage larger than the first voltage to the first wiring, and supplies a first signal voltage to at least one of gate electrodes of the second transistors on the second current paths corresponding to at least a part of the plurality of second conductive layers, and the first signal voltage turns the second transistors OFF.

A semiconductor memory device includes: a plurality of first conductive layers arranged in a first direction; a plurality of second conductive layers spaced from the plurality of first conductive layers in a second direction intersecting with the first direction, the plurality of second conductive layers being arranged in the first direction; a first semiconductor layer disposed between the plurality of first conductive layers and the plurality of second conductive layers, the first semiconductor layer extending in the first direction and opposing the plurality of first conductive layers and the plurality of second conductive layers; a charge storage layer that includes a first part and a second part, the first part being disposed between the plurality of first conductive layers and the first semiconductor layer, and the second part being disposed between the plurality of second conductive layers and the first semiconductor layer; and a first wiring electrically connected to the first semiconductor layer. The semiconductor memory device is configured to execute: a first erase operation that supplies a first voltage to at least a part of the plurality of first conductive layers, supplies a second voltage larger than the first voltage to at least a part of the plurality of second conductive layers, and supplies an erase voltage larger than the first voltage to the first wiring; a second erase operation that supplies the first voltage to at least a part of the plurality of second conductive layers, supplies the second voltage to at least a part of the plurality of first conductive layers, and supplies the erase voltage to the first wiring; and a first program operation that supplies a first program voltage larger than the first voltage to one of the plurality of first conductive layers and supplies a write pass voltage to at least a part of the plurality of first conductive layers, the write pass voltage being larger than the first voltage and smaller than the first program voltage. The semiconductor memory device executes the first program operation to at least apart of the plurality of first conductive layers after the execution of the first erase operation and before the execution of the second erase operation.

Next, semiconductor memory devices according to embodiments are described in detail with reference to the drawings. The following embodiments are only examples, and are not described for the purpose of limiting the present invention. The following drawings are schematic, and for convenience of description, apart of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a control die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X-direction, the Y-direction, and the Z-direction and need not to correspond to these directions.

Expressions, such as "above" and "below," in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on aside opposite to the substrate of this configuration. A surface intersecting with the X-direction or the Y-direction is referred to as aside surface and the like.

First Embodiment

[Configuration]

Figure 2:
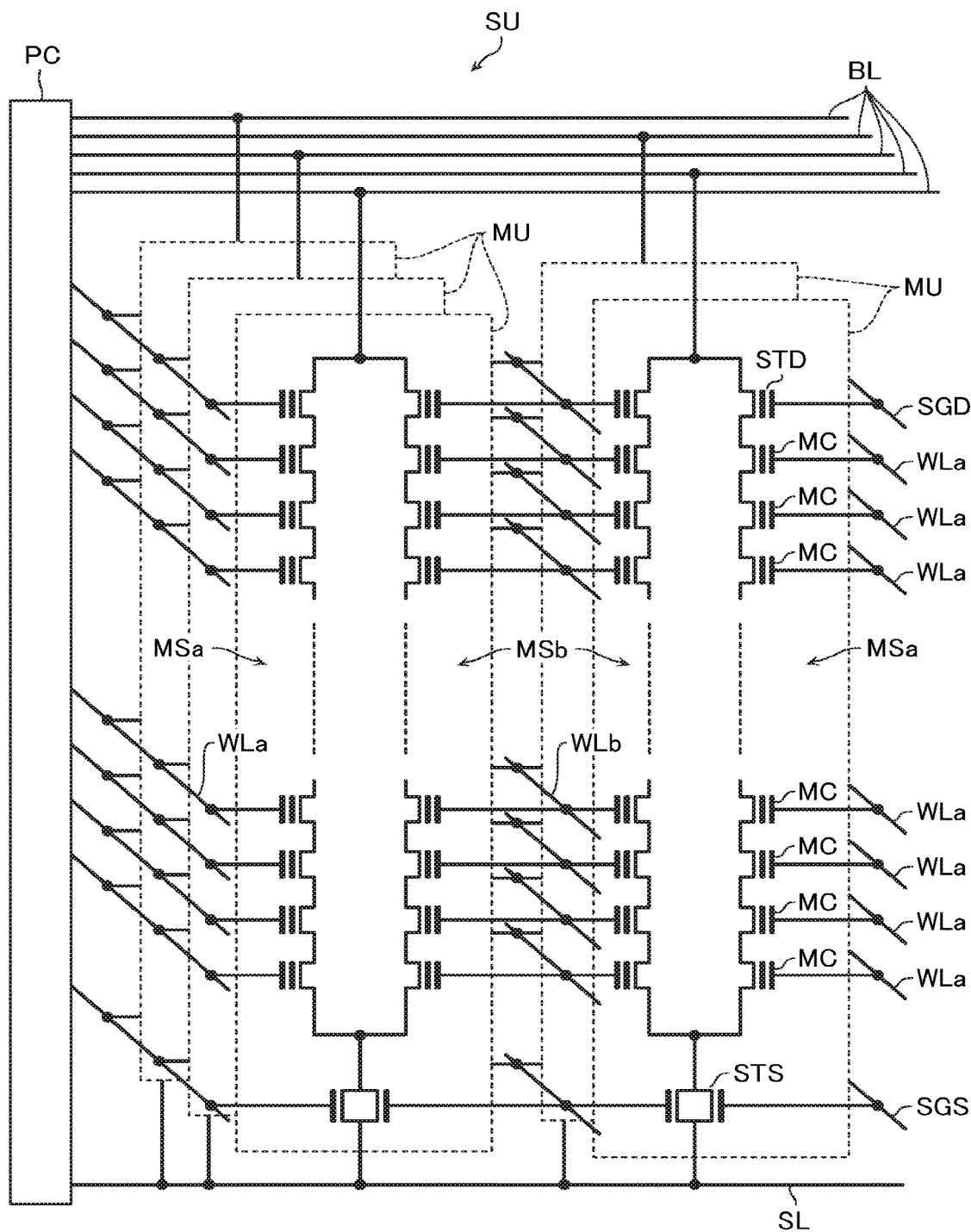
FIG. 2 is a schematic equivalent circuit diagram of the semiconductor memory device.
Figure 3:
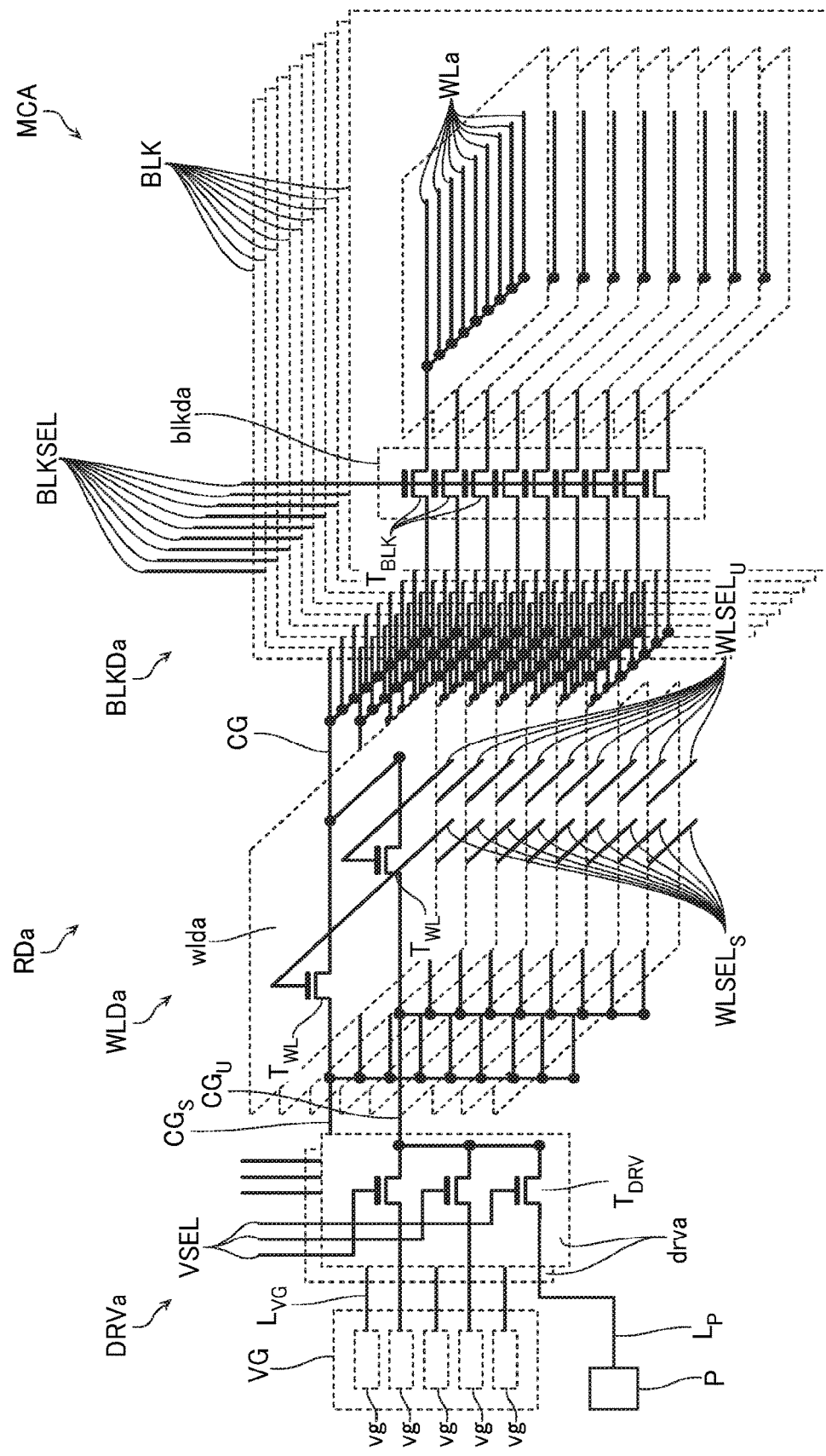
FIG. 3 is a schematic equivalent circuit diagram of the semiconductor memory device.

FIG. 1 is a schematic block diagram illustrating a part of a configuration of a semiconductor memory device according to the first embodiment. FIG. 2 and FIG. 3 are schematic equivalent circuit diagrams illustrating a part of the configuration of the semiconductor memory device.

As illustrated in FIG. 1, the semiconductor memory device according to the embodiment includes a memory cell array MCA and a peripheral circuit PC that controls the memory cell array MCA.

The memory cell array MCA includes a plurality of memory blocks BLK. The memory block BLK includes a plurality of string units SU. For example, as illustrated in FIG. 2, the string unit SU includes a plurality of memory units MU. The plurality of memory units MU each include two memory strings MSa, MSb, which are electrically independent. One ends of these memory strings MSa, MSb are connected to respective drain-side select transistor STD and connected to a common bit line BL via these. The other ends of the memory strings MSa, MSb are connected to a common source-side select transistor STS and connected to a common source line SL via these.

The memory strings MSa, MSb each include a plurality of memory cells MC connected in series. The memory cell MC is a field-effect type transistor that includes a semiconductor layer, a gate insulating layer, and a gate electrode. The semiconductor layer functions as a channel region. The gate insulating layer includes a charge storage layer that can store data. A threshold voltage of the memory cell MC changes according to an amount of electric charge in the charge storage layer. The gate electrodes of the plurality of memory cells MC corresponding to the memory string MSa are each connected to a word line WLa. The gate electrodes of the plurality of memory cells MC corresponding to the memory string MSb are each connected to a word line WLb. The word lines WLa, WLb are each connected to all of the memory units MU in the memory block BLK.

The select transistor (STD, STS) is a field-effect type transistor that includes a semiconductor layer, a gate insulating layer, and a gate electrode. The semiconductor layer functions as a channel region. The gate electrode of the drain-side select transistor STD is connected to a drain-side select gate line SGD. The drain-side select gate line SGD is connected to all of the memory units MU in the string unit SU. The gate electrode of the source-side select transistor STS is connected to a source-side select gate line SGS. The source-side select gate line SGS is connected to all of the memory units MU in the memory block BLK.

For example, as illustrated in FIG. 1, the peripheral circuit PC includes row decoders RDa, RDb, a sense amplifier module SAM, and voltage generation circuits VG. The row decoders RDa, RDb are connected to the memory cell array MCA. The sense amplifier module SAM is connected to the memory cell array MCA. The voltage generation circuits VG are connected to the row decoders RDa, RDb and the sense amplifier module SAM. The peripheral circuit PC includes a sequencer, an address register, a status register, and the like, which are not illustrated.

For example, as illustrated in FIG. 3, the row decoder RDa includes a block decoder BLKDa, a word line decoder WLDa, and a driver circuit DRVa.

The block decoder BLKDa includes a plurality of block decode units blkda disposed corresponding to a plurality of memory blocks BLK in the memory cell array MCA. The block decode unit blkda includes a plurality of transistors $T_{BLK}$ disposed corresponding to a plurality of word lines WLa in the memory block BLK. The transistor $T_{BLK}$ is, for example, a field-effect type NMOS transistor. A drain electrode of the transistor $T_{BLK}$ is connected to the word line WLa. A source electrode of the transistor $T_{BLK}$ is connected to a wiring CG. The wiring CG is connected to all of the block decode units blkda in the block decoder BLKDa. A gate electrode of the transistor $T_{BLK}$ is connected to a signal supply line BLKSEL. A plurality of the signal supply lines BLKSEL are disposed corresponding to all of the block decode units blkda. The signal supply line BLKSEL is connected to all of the transistors $T_{BLK}$ in the block decode unit blkda.

In a read operation, a write sequence, and the like, for example, one signal supply line BLKSEL corresponding to a block address in the address register (not illustrated) becomes an "H" state, and the other signal supply lines BLKSEL become an "L" state. For example, a predetermined driving voltage having a positive magnitude is supplied to the one signal supply line BLKSEL, and a ground voltage $V_{SS}$ or the like is supplied to the other signal supply lines BLKSEL. Accordingly, all of the word lines WLa in one memory block BLK corresponding to this block address are electrically conducted to all of the wirings CG. All of the word lines WLa in the other memory blocks BLK become a floating state.

The word line decoder WLDa includes a plurality of word line decode units wlda disposed corresponding to the plurality of memory cells MC in the memory string MSa. In the illustrated example, the word line decode unit wlda includes two transistors $T_{WL}$. The transistor $T_{WL}$ is, for example, a field-effect type NMOS transistor. A drain electrode of the transistor $T_{WL}$ is connected to the wiring CG. A source electrode of the transistor $T_{WL}$ is connected to a wiring $CG_S$ or a wiring $CG_U$. A gate electrode of the transistor $T_{WL}$ is connected to a signal supply line $WLSEL_S$ or a signal supply line $WLSEL_U$. A plurality of the signal supply lines $WLSEL_S$ are disposed corresponding to one transistors $T_{WL}$ included in all of the word line decode units wlda. A plurality of the signal supply lines $WLSEL_U$ are disposed corresponding to the other transistors $T_{WL}$ included in all of the word line decode units wlda.

In a read operation, a write sequence, and the like, for example, the signal supply line $WLSEL_S$ corresponding to one word line decode unit wlda corresponding to a page address in the address register (not illustrated) becomes the "H" state, and the signal supply line $WLSEL_U$ corresponding to this becomes the "L" state. The signal supply lines $WLSEL_S$ corresponding to the other word line decode units wlda become the "L" state, and the signal supply lines $WLSEL_U$ corresponding to them become the "H" state. The wiring $CG_S$ is supplied with a voltage corresponding to the selected word line WL. The wiring $CG_U$ is supplied with a voltage corresponding to an unselected word line WL. Accordingly, one word line WLa corresponding to the above-described page address is supplied with the voltage corresponding to the selected word line WL. The other word lines WLa are supplied with the voltage corresponding to the unselected word line WL. When the page address in the address register (not illustrated) corresponds to not the word line WLa but the word line WLb, the voltage corresponding to the unselected word line WL is supplied to all of the word lines WLa in some cases.

The driver circuit DRVa includes, for example, two driver units drva disposed corresponding to the wiring $CG_S$ and the wiring $CG_U$. The driver unit drva includes a plurality of transistors $T_{DRV}$. The transistor $T_{DRV}$ is, for example, a field-effect type NMOS transistor. A drain electrode of the transistor $T_{DRV}$ is connected to the wiring $CG_S$ or the wiring $CG_U$. A source electrode of the transistor $T_{DRV}$ is connected to a voltage supply line $L_{VG}$ or a voltage supply line $L_P$. The voltage supply line $L_{VG}$ is connected to one of a plurality of output terminals of the voltage generation circuit VG. The voltage supply line $L_P$ is connected to a bonding pad electrode P to which the ground voltage $V_{SS}$ is supplied. A gate electrode of the transistor $T_{DRV}$ is connected to a signal supply line VSEL.

In a read operation, a write sequence, and the like, for example, any of a plurality of the signal supply lines VSEL corresponding to one driver unit drva becomes the "H" state, and the other signal supply lines VSEL become the "L" state.

The row decoder RDb is configured approximately similarly to the row decoder RDa. However, the transistors $T_{BLK}$, $T_{WL}$, and $T_{DRV}$, the wirings CG, $CG_S$, and $CG_U$, and the like in the row decoder RDb are electrically connected to not the word line WLa but the word line WLb.

For example, as illustrated in FIG. 3, the voltage generation circuit VG includes a plurality of voltage generation units vg. In a read operation, a write sequence, and the like, the voltage generation unit vg generates a voltage of a predetermined magnitude, and outputs it via the voltage supply line $L_{VG}$. The voltage generation unit vg may be a step up circuit, such as a charge pump circuit, or may be a step down circuit, such as a regulator.

The sense amplifier module SAM (FIG. 1) includes a plurality of sense amplifier units (not illustrated) disposed corresponding to a plurality of bit lines BL (FIG. 2). The sense amplifier unit includes a sense transistor, a plurality of data latch circuits, and a voltage adjustment circuit. The sense transistor includes a gate electrode electrically connected to the bit line BL. The plurality of data latch circuits are connected to a drain electrode of the sense transistor. The voltage adjustment circuit adjusts a voltage of the bit line BL in accordance with data of one of the plurality of data latch circuits.

Figure 4:
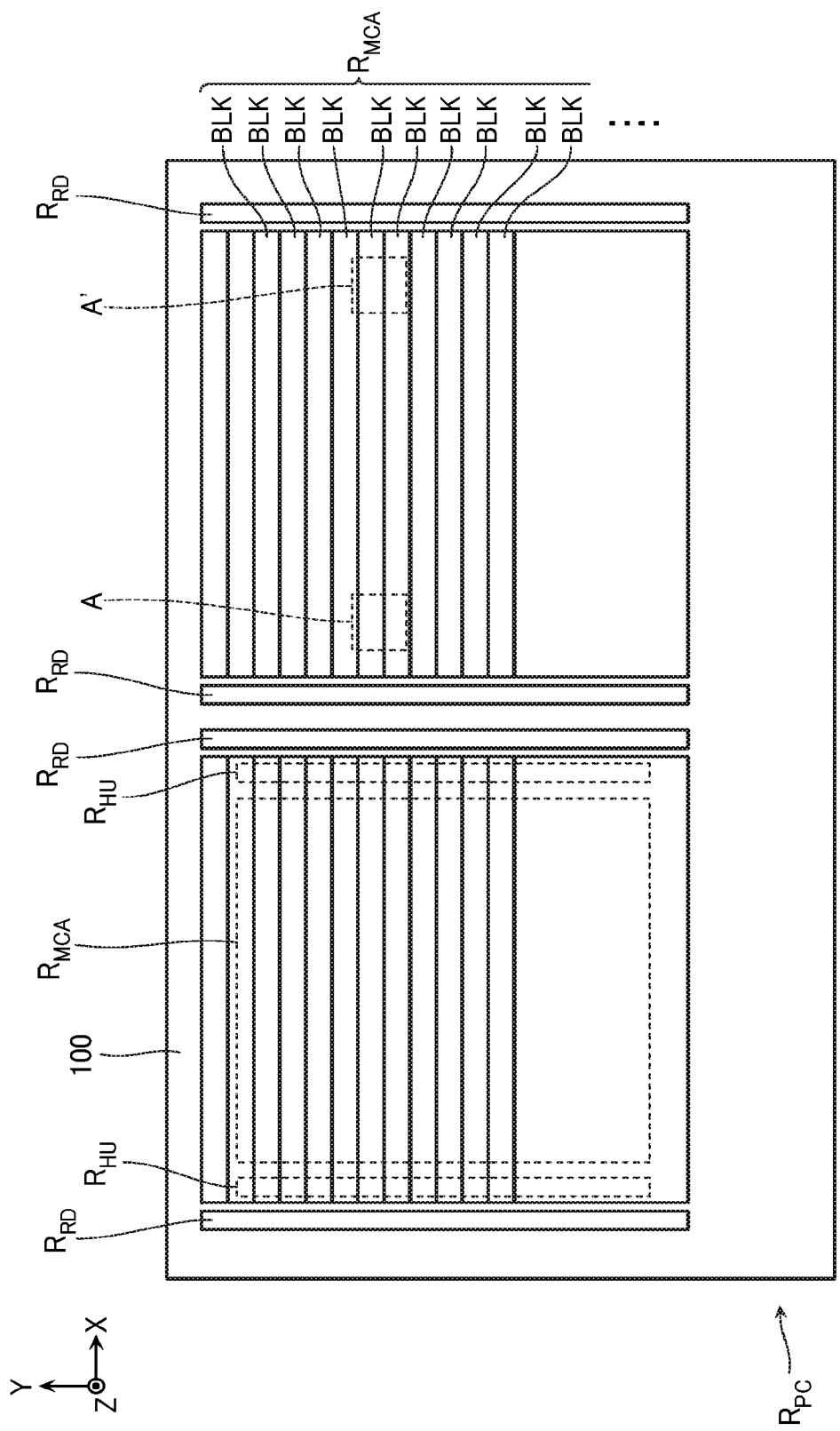
FIG. 4 is a schematic plan view of the semiconductor memory device.
Figure 5:
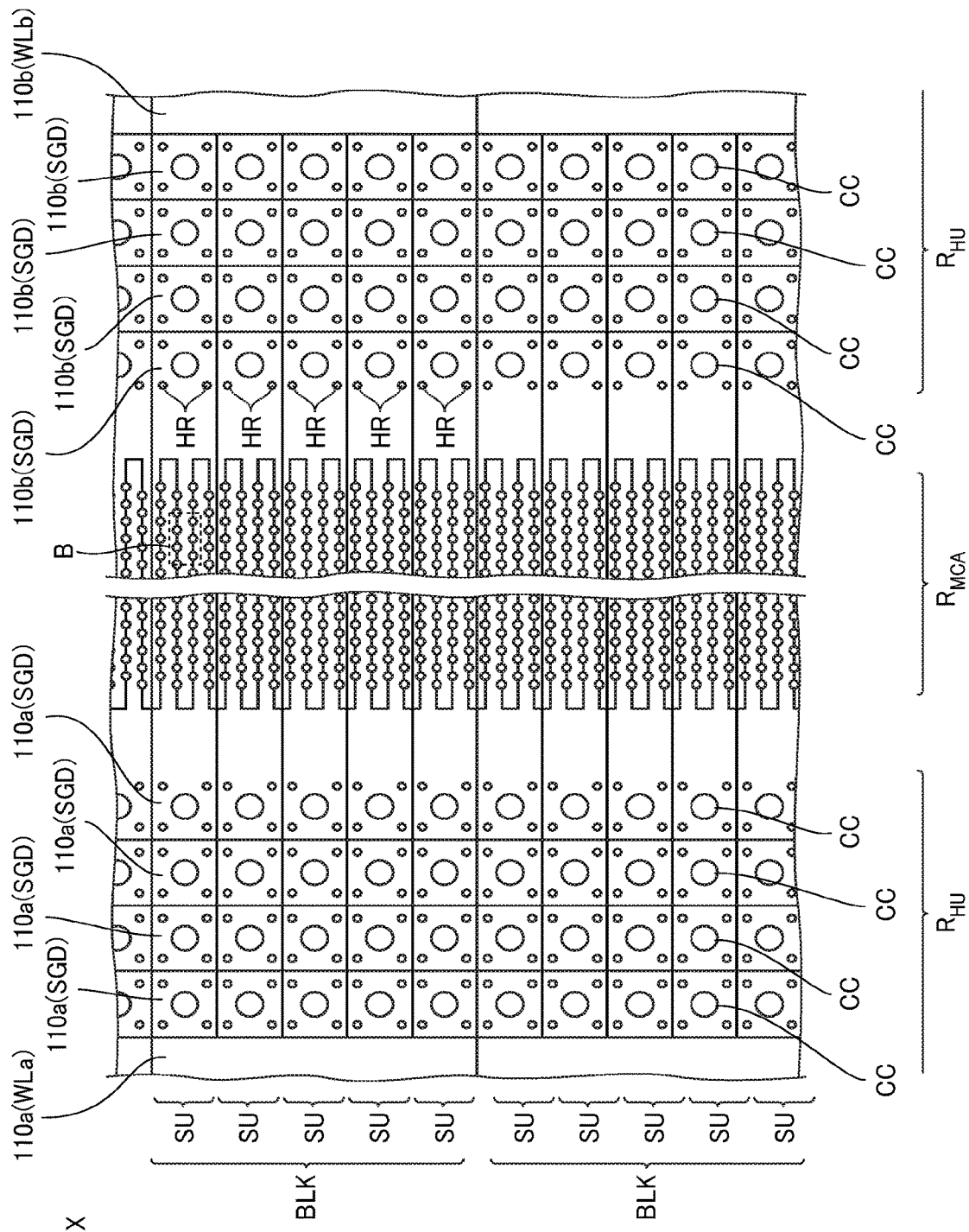
FIG. 5 is a schematic plan view of the semiconductor memory device.
Figure 6:
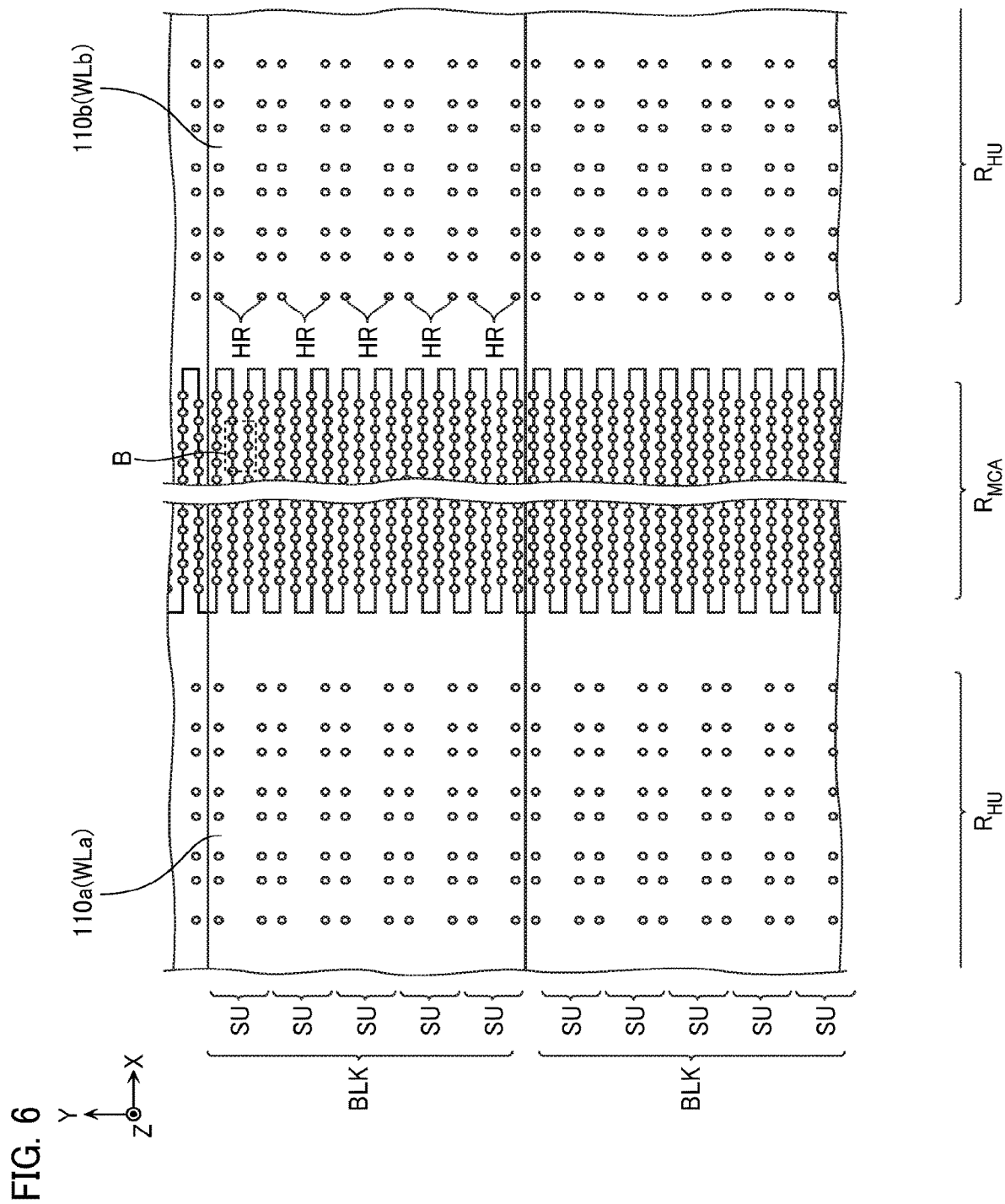
FIG. 6 is a schematic plan view of the semiconductor memory device.
Figure 7:
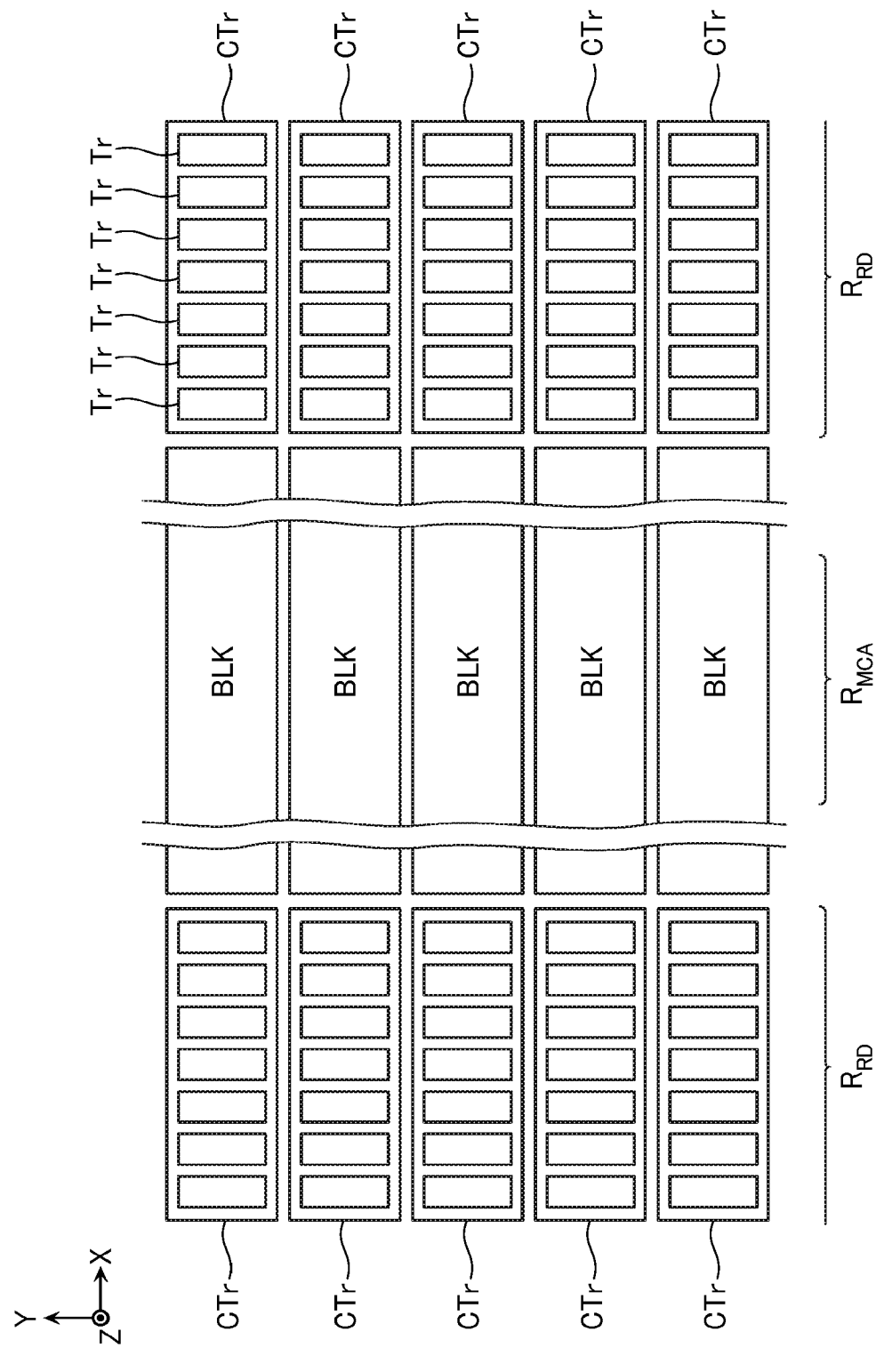
FIG. 7 is a schematic plan view of the semiconductor memory device.
Figure 8:
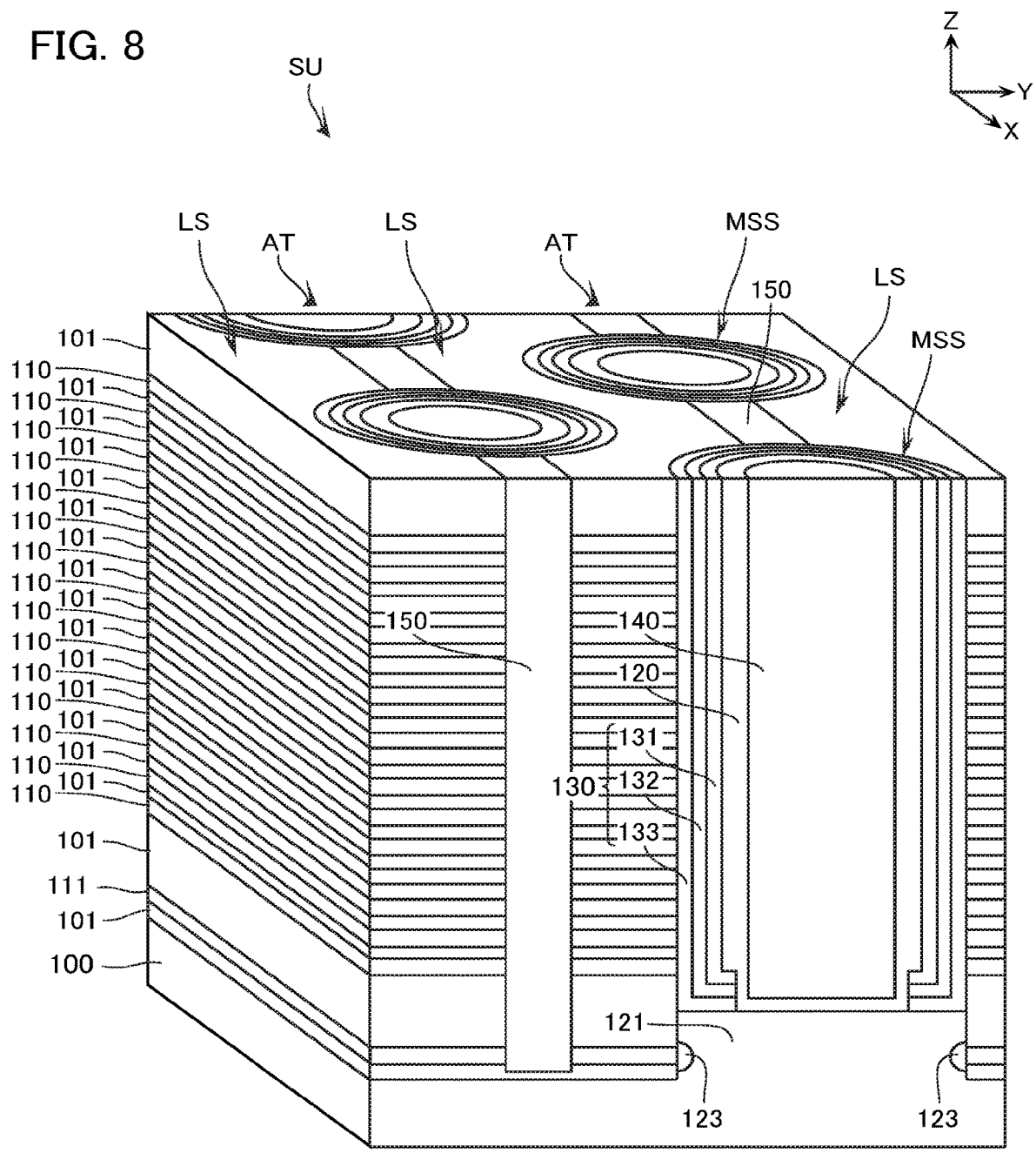
FIG. 8 is a schematic perspective view of the semiconductor memory device.
Figure 9:
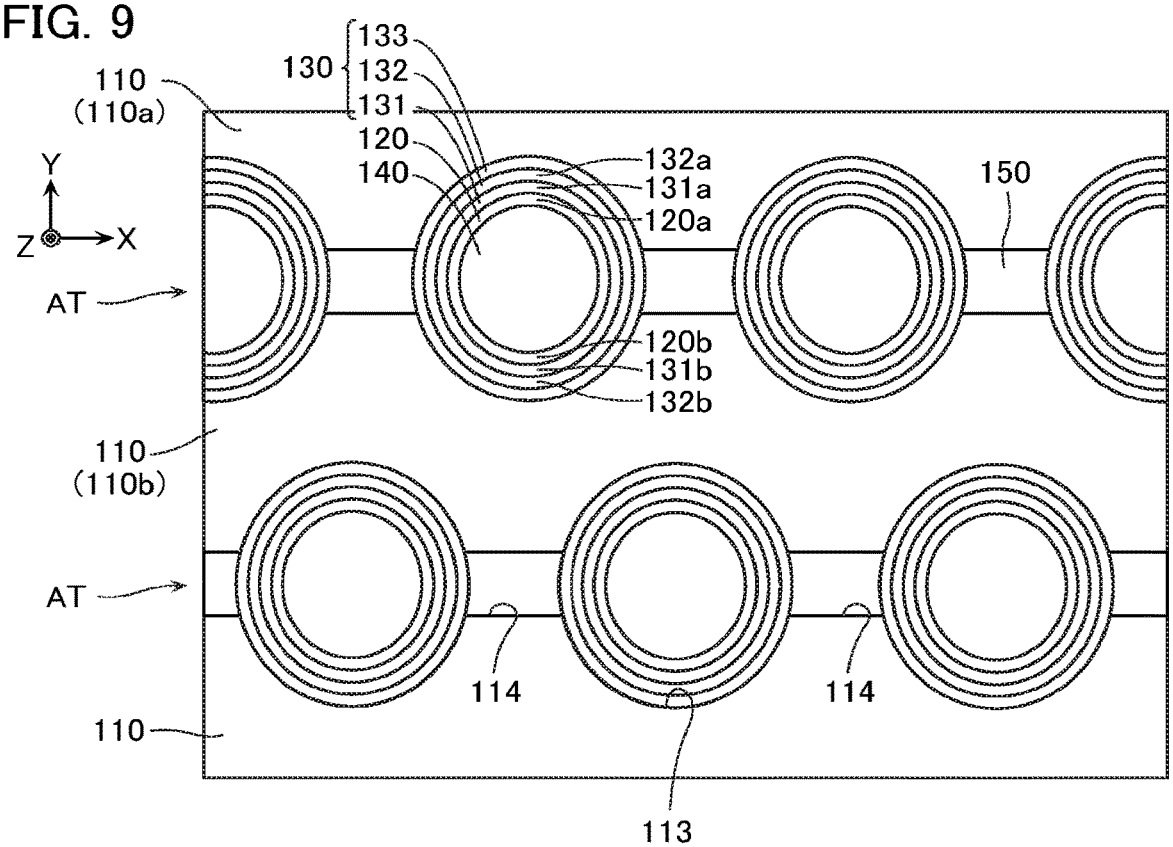
FIG. 9 is a schematic plan view of the semiconductor memory device.

Next, with reference to FIG. 4 to FIG. 9, an exemplary configuration of the semiconductor memory device according to the embodiment will be described. FIG. 4 is a schematic plan view illustrating the configuration of the semiconductor memory device according to the embodiment. FIG. 5 and FIG. 6 are schematic plan views illustrating enlarged parts indicated by A and A' in the structure illustrated in FIG. 4. Note that, in FIG. 6, a part of the structure illustrated in FIG. 5 is omitted. FIG. 7 is a schematic plan view illustrating an enlarged part of the structure illustrated in FIG. 4. FIG. 8 is a schematic perspective view illustrating the configuration of the semiconductor memory device according to the embodiment. FIG. 9 is a schematic plan view illustrating enlarged parts indicated by B in FIG. 5 and FIG. 6.

As illustrated in FIG. 4, the semiconductor memory device according to the embodiment includes a semiconductor substrate 100. In the illustrated example, the semiconductor substrate 100 includes two memory cell array regions $R_{MCA}$ arranged in the X-direction. Hook-up regions $R_{HU}$ and row decoder regions $R_{RD}$ far from the memory cell array region $R_{MCA}$ compared with the hook-up regions $R_{HU}$ are disposed at positions side by side with the memory cell array region $R_{MCA}$ in the X-direction. A peripheral circuit region $R_{PC}$ is disposed at an end portion in the Y-direction of the semiconductor substrate 100.

The semiconductor substrate 100 is a semiconductor substrate of, for example, a single-crystal silicon (Si) containing p-type impurities. An n-type well containing n-type impurities and a p-type well containing p-type impurities are disposed on an upper surface of the semiconductor substrate. On the surface of the semiconductor substrate 100, for example, a transistor, a wiring, and the like constituting at least a part of the peripheral circuit PC (FIG. 1) are disposed.

The memory cell array region $R_{MCA}$ includes a plurality of memory blocks BLK arranged in the Y-direction. For example, as illustrated in FIG. 5, the memory block BLK includes a plurality of string units SU arranged in the Y-direction.

For example, as illustrated in FIG. 8, the string unit SU includes a plurality of stacked structures LS arranged in the Y-direction and trench structures AT disposed between the plurality of stacked structures LS. The stacked structure LS includes a plurality of conductive layers 110 stacked in the Z-direction. The trench structure AT includes a plurality of memory string structures MSS arranged in the X-direction. The memory string structures MSS each include a semiconductor layer 120, a gate insulating layer 130, and an insulating layer 140. The semiconductor layer 120 extends in the Z-direction and has an approximately closed-bottomed cylindrical shape. The gate insulating layer 130 is disposed between the stacked structure LS and the semiconductor layer 120. The insulating layer 140 of silicon oxide ($SiO_2$) or the like is disposed at the center part of the semiconductor layer 120. Insulating layers 150 of silicon oxide ($SiO_2$) or the like are disposed between the plurality of memory string structures MSS arranged in the X-direction.

The conductive layer 110 is an approximately plate-shaped conductive layer extending in the X-direction, and is, for example, a stacked film of titanium nitride (TiN) and tungsten (W), or a conductive layer of polycrystalline silicon (Si) injected with impurities. A part of the conductive layers 110 each function as the word line WLa or the word line WLb, and the gate electrode of the memory cell MC (FIG. 2). A part of the conductive layers 110 disposed thereabove functions as the drain-side select gate line SGD and the gate electrode of the drain-side select transistor STD (FIG. 2).

A conductive layer 111 containing a material, for example, similar to that of the conductive layer 110 is disposed below the plurality of conductive layers 110. The conductive layer 111 functions as the source-side select gate line SGS and the gate electrode of the source-side select transistor STS (FIG. 2).

Insulating layers 101 of silicon oxide ($SiO_2$) or the like are disposed between the plurality of conductive layers 110, between the lowermost conductive layer 110 and the conductive layer 111, and between the conductive layer 111 and the semiconductor substrate 100.

In the example of FIG. 9, a contact surface 113 between the conductive layer 110 and the gate insulating layer 130 is formed in a curved shape along an outer periphery of an approximately circular region (for example, a region in any shape including a circular shape, an ellipse shape, or an oval shape) having the center axis of the insulating layer 140 as the center. A contact surface 114 between the conductive layer 110 and the insulating layer 150 is linearly formed to extend in the X-direction.

Hereinafter, a plurality of conductive layers 110 included in the even-numbered or odd-numbered stacked structures LS counting from one side in the Y-direction among the plurality of stacked structures LS arranged in the Y-direction are referred to as conductive layers 110a in some cases. The plurality of conductive layers 110 included in the other stacked structures LS are referred to as conductive layers 110b in some cases.

The conductive layer 110a functions as the gate electrode of the memory cell MC included in the memory string MSa and the word line WLa, the gate electrode of the drain-side select transistor STD included in the memory string MSa, or the like. As illustrated in FIG. 6, in a predetermined X-Y cross-sectional surface, among the plurality of conductive layers 110a arranged in the Y-direction, one end portions (left end portions in FIG. 6) in the X-direction of the ones included in one memory block BLK are connected in common. These plurality of conductive layers 110a function as, for example, one word line WLa. As illustrated in FIG. 5, in the predetermined X-Y cross-sectional surface, among the plurality of conductive layers 110a arranged in the Y-direction, one end portions (left end portions in FIG. 5) in the X-direction of the ones included in one string unit SU are connected in common. These plurality of conductive layers 110a function as, for example, one drain-side select gate line SGD.

The conductive layer 110b functions as the gate electrode of the memory cell MC included in the memory string MSb and the word line WLb, the gate electrode of the drain-side select transistor STD included in the memory string MSb, or the like. As illustrated in FIG. 6, in the predetermined X-Y cross-sectional surface, among the plurality of conductive layers 110b arranged in the Y-direction, the other end portions (right end portions in FIG. 6) in the X-direction of the ones included in one memory block BLK are connected to in common. These plurality of conductive layers 110b function as, for example, one word line WLb. As illustrated in FIG. 5, in the predetermined X-Y cross-sectional surface, among the plurality of conductive layers 110b arranged in the Y-direction, the other end portions (right end portions in FIG. 5) in the X-direction of the ones included in one string unit SU are connected in common. These plurality of conductive layers 110b function as, for example, one drain-side select gate line SGD.

The semiconductor layer 120 (FIG. 8) is a semiconductor layer of non-doped polycrystalline silicon (Si) or the like. The semiconductor layer 120 has an approximately closed-bottomed cylindrical shape as described above. The semiconductor layer 120 functions as the plurality of memory cells MC and channel regions of the drain-side select transistors STD included in the memory strings MSa, MSb (FIG. 2).

A semiconductor layer 121 (FIG. 8) is connected to the lower end of the semiconductor layer 120. The semiconductor layer 121 is opposed to the two conductive layers 111 mutually adjacent in the Y-direction. The semiconductor layer 121 is a semiconductor layer of single-crystal silicon (Si) or the like, and functions as a channel region of the source-side select transistor STS (FIG. 2). An insulating layer 123 of silicon oxide ($SiO_2$) or the like is disposed between the semiconductor layer 121 and the conductive layer 111.

In the example of FIG. 8, the semiconductor substrate 100 functions as a part of the source line SL (FIG. 2), and the semiconductor layer 120 is electrically connected to the peripheral circuit PC via the semiconductor layer 121 and the semiconductor substrate 100. However, this configuration is merely an example, and the specific configuration appropriately adjustable. For example, the semiconductor layer 121 may be omitted, a wiring or the like that functions as a part of the source line SL (FIG. 2) maybe disposed below or above the memory block BLK, and the semiconductor layer 120 may be electrically connected to the peripheral circuit PC via the wiring or the like.

The gate insulating layer 130 has an approximately cylindrical shape, and extends in the Z-direction along an outer peripheral surface of the semiconductor layer 120. The gate insulating layer 130 includes a tunnel insulating layer 131 of silicon oxide ($SiC_2$) or the like, a charge storage layer 132 of silicon nitride (SiN) or the like, and a block insulating layer 133 of silicon oxide ($SiO_2$) or the like, which are disposed from the semiconductor layer 120 side to the conductive layer 110 side.

For example, as illustrated in FIG. 5, the hook-up region $R_{HU}$ includes a plurality of contacts CC and supporting structures HR disposed at the proximities of the plurality of contacts CC. The plurality of contacts CC are each connected to the conductive layer 110. The supporting structures HR each penetrate the plurality of conductive layers 110 stacked in the Z-direction. The supporting structure HR may be an insulating layer of silicon oxide ($SiO_2$) or the like.

For example, as illustrated in FIG. 7, the row decoder region $R_{RD}$ includes a plurality of transistor rows CTr arranged in the Y-direction. In this embodiment, an arrangement period in the Y-direction of the transistor row CTr is equal to an arrangement period in the Y-direction of the memory block BLK. The plurality of transistor rows CTr each include a plurality of transistors Tr arranged in the X-direction. The plurality of transistors Tr are, for example, field-effect type transistors that use the surface of the semiconductor substrate 100 as the channel region, the source region, and the drain region. The plurality of transistors Tr are each connected to the conductive layer 110 via the contact CC. The plurality of transistors Tr each function as the transistor $T_{BLK}$ described with reference to FIG. 3. The number of the transistors Tr included in the transistor row CTr is equal to, for example, the number of the conductive layers 110a or the number of the conductive layers 110b stacked in the Z-direction in the memory block BLK.

[Threshold Voltage of Memory Cell MC]

Next, with reference to FIG. 10, the threshold voltage of the memory cell MC will be described.

As described above, the memory cell array MCA includes a plurality of memory cells MC. When a write sequence is executed to the plurality of memory cells MC, the threshold voltages of the memory cells MC are controlled in a plurality of states.

Figure 10:
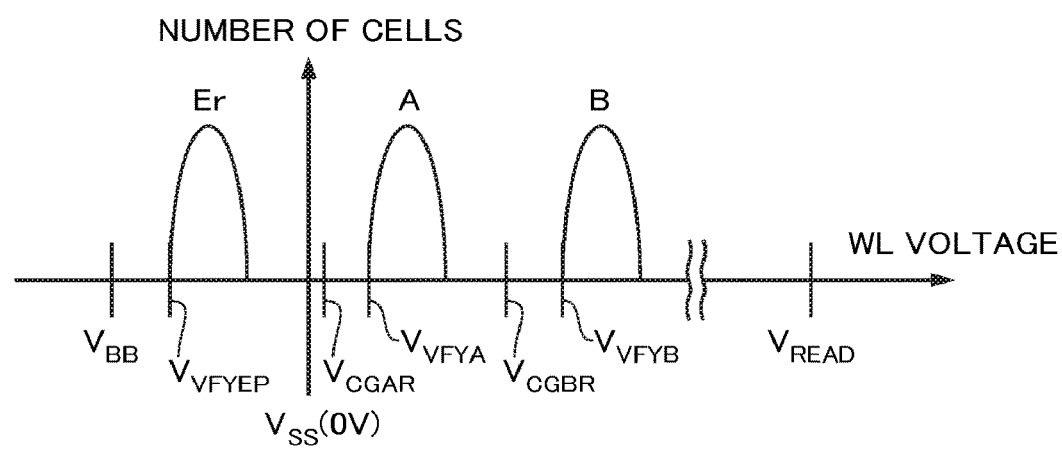
FIG. 10 is a schematic histogram for describing a threshold voltage of a memory cell MC.

FIG. 10 is a schematic histogram for describing the threshold voltage of the memory cell MC in which data of a plurality of bits is recorded. The horizontal axis indicates the voltage of the word line WL, and the vertical axis indicates the number of the memory cells MC.

FIG. 10 illustrates three distributions of the threshold voltages of the memory cells MC. For example, the threshold voltages of the memory cells MC controlled in a state Er are larger than a read blocking voltage $V_{BB}$ and smaller than a read voltage $V_{CGAR}$. The smallest threshold voltage included in the threshold distribution of the state Er has a magnitude approximately equal to a magnitude of a verify voltage $V_{VFYEP}$. The threshold voltages of the memory cells MC controlled in a state A are larger than the read voltage $V_{CGAR}$ and smaller than a read voltage $V_{CCBR}$. The smallest threshold voltage included in the threshold distribution of the state A has a magnitude approximately equal to a magnitude of a verify voltage $V_{VFYA}$. The threshold voltages of the memory cells MC controlled in a state B are larger than the read voltage $V_{CGBR}$. The smallest threshold voltage included in the threshold distribution of the state B has a magnitude approximately equal to a magnitude of a verify voltage $V_{VFYB}$. The threshold voltages of all of the memory cells MC are smaller than a read pass voltage $V_{READ}$.

The data of one bit or a plurality of bits is assigned to each of these threshold distributions.

For example, when 3-bit data is assigned to the memory cell MC, the threshold voltage of the memory cell MC is controlled to belong to any of $2^3=8$ patterns of the threshold distribution. Any data of "0, 0, 0," "0, 0, 1," "0, 1, 0," "0, 1, 1," "1, 0, 0," "1, 0, 1," "1, 1, 0," and "1, 1, 1" is assigned to the eight patterns of the threshold distribution.

For example, when 1-bit data is assigned to the memory cell MC, the threshold voltage of the memory cell MC is controlled to belong to any of $2^1=2$ patterns of the threshold distribution. Any data of "0" or "1" is assigned to the two patterns of the threshold distribution.

[Read Operation]

Figure 11:
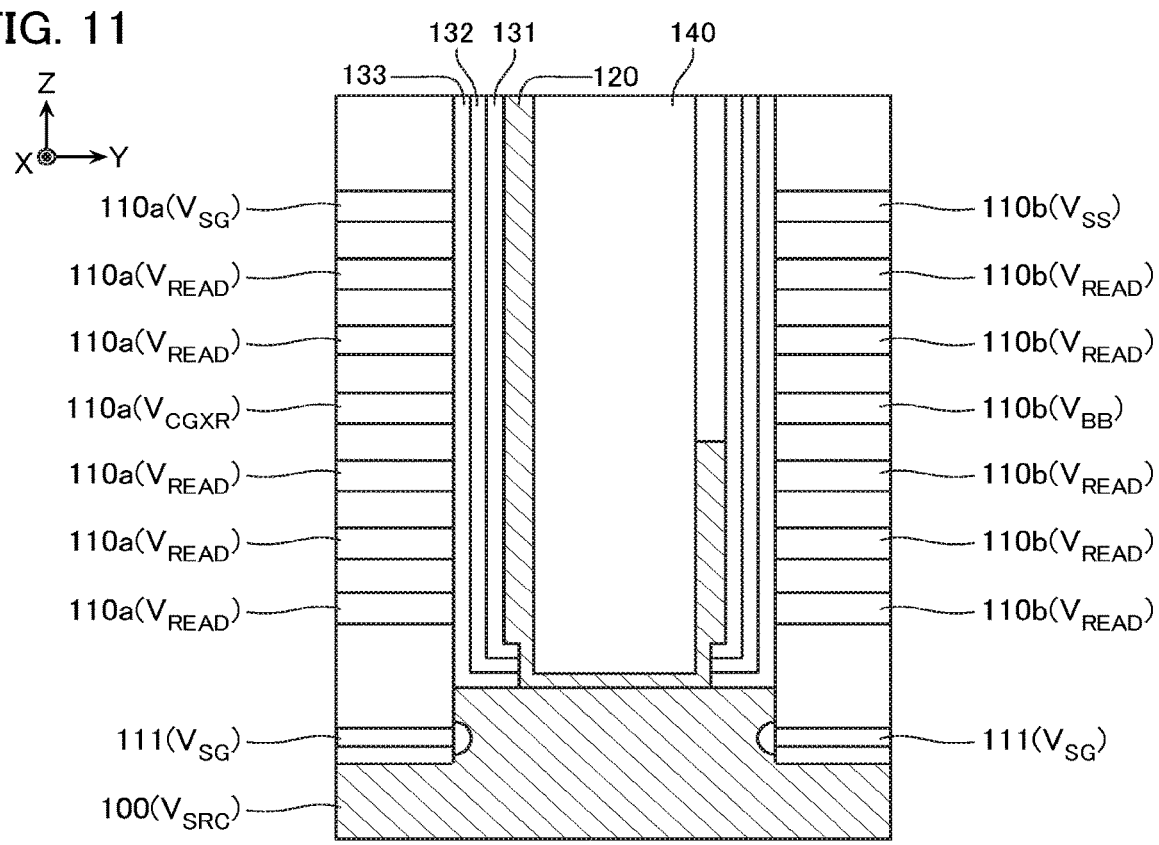
FIG. 11 is a schematic cross-sectional view for describing a read operation of the semiconductor memory device.

Next, with reference to FIG. 11, the read operation of the semiconductor memory device according to the embodiment will be described. FIG. 11 is a schematic cross-sectional view for describing the read operation. The read operation according to the embodiment is collectively executed to all of the memory cells MC included in the specified string unit SU of the specified memory block BLK and connected to the specified word line WLa or word line WLb. Hereinafter, the configuration including the plurality of memory cells MC is referred to as a page in some cases. FIG. 11 describes an example in which the read operation is executed to the page corresponding to the memory string MSa.

As illustrated in FIG. 11, in the read operation, a read voltage $V_{CGXR}$ (read voltage $V_{CGAR}$, $V_{CGBR}$, or another read voltage in FIG. 10) is supplied to the conductive layer 110a that functions as the selected word line WL, the read pass voltage $V_{READ}$ is supplied to the conductive layer 110a that functions as the unselected word line WL, and a voltage $V_{SG}$ is supplied to the conductive layer 110a that functions as the drain-side select gate line SGD. The read blocking voltage $V_{BB}$ is supplied to the conductive layer 110b mutually adjacent to the selected word line WL in the Y-direction, the read pass voltage $V_{READ}$ is supplied to the other conductive layers 110b that function as the unselected word lines WL, and the ground voltage $V_{SG}$ is supplied to the conductive layer 110b that function as the drain-side select gate line SGD. The voltage $V_{SG}$ is supplied to the conductive layer 111 that functions as the source-side select gate line SGS, and a source voltage $V_{SRC}$ is supplied to the semiconductor substrate 100.

The voltage $V_{SG}$ is a voltage of a degree in which the drain-side select transistor STD and the source-side select transistor STS turn ON, and larger than the ground voltage $V_{SS}$. The source voltage $V_{SRC}$ is a voltage having a magnitude approximately the same as that of the ground voltage $V_{SS}$, and is larger than the ground voltage $V_{SS}$.

Accordingly, an electron channel that electrically conducts the bit line BL to the channel region of a selected memory cell MC, and an electron channel that electrically conducts the source line SL to the channel region of the selected memory cell MC are formed in the semiconductor layer 120. The selected memory cell MC turns ON or OFF depending on the electric charge amount accumulated in the charge storage layer 132 of the selected memory cell MC. The peripheral circuit PC (FIG. 1) detects, for example, the magnitude of the voltage of the bit line BL or the magnitude of the current flowing in the bit line BL, thereby determining the data recorded in the memory cell MC.

In FIG. 11, the read blocking voltage $V_{BB}$ is supplied to one of the plurality of conductive layers 110b, and the read pass voltage $V_{READ}$ is supplied to the other conductive layers 110b that function as the unselected word lines WL. However, this method is merely an example, and the specific method is appropriately adjustable. For example, the read blocking voltage $V_{BB}$ may be supplied to all of the conductive layers 110b that function as the word lines WL.

[Write Sequence]

Figure 12:
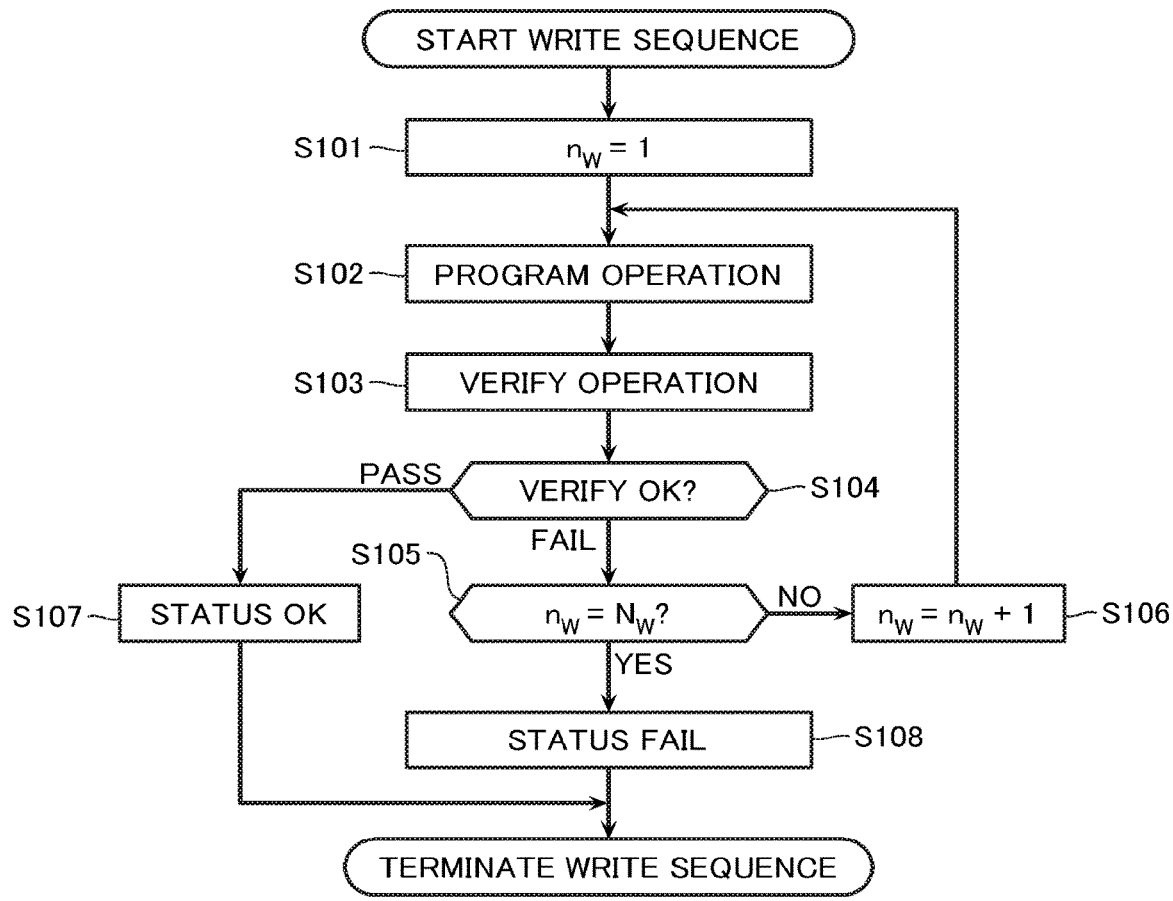
FIG. 12 is a schematic flowchart for describing a write sequence of the semiconductor memory device.
Figure 13:
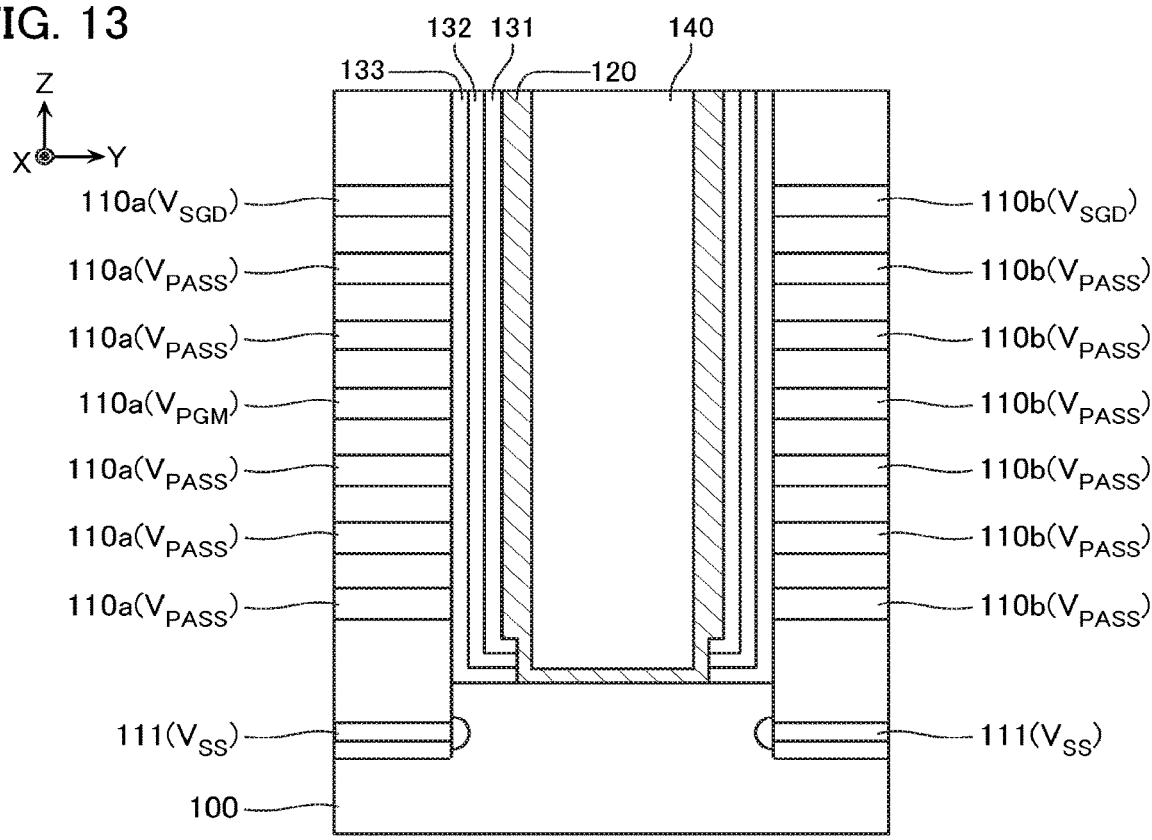
FIG. 13 is a schematic cross-sectional view for describing the write sequence of the semiconductor memory device.
Figure 14:
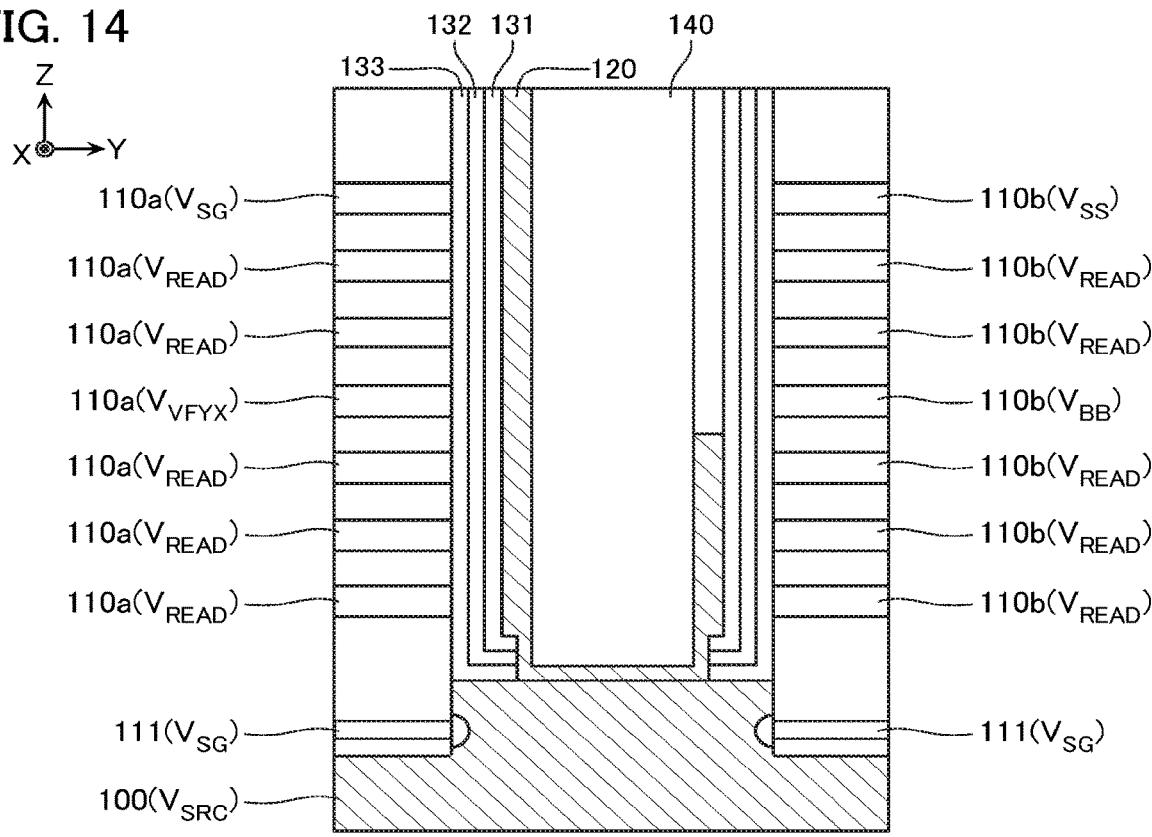
FIG. 14 is a schematic cross-sectional view for describing the write sequence of the semiconductor memory device.

Next, with reference to FIG. 12 to FIG. 14, the write sequence of the semiconductor memory device according to the embodiment will be described. FIG. 12 is a schematic flowchart for describing the write sequence. FIG. 13 and FIG. 14 are schematic cross-sectional views for describing the write sequence. The write sequence according to the embodiment is collectively executed to the memory cells MC in the specified page. FIG. 13 and FIG. 14 describe an example in which the write sequence is executed to the page corresponding to the memory string MSa.

In Step S101 (FIG. 12), a loop count $n_W$ is set to 1. The loop count $n_W$ is recorded to a register or the like.

In Step S102, a program operation is executed.

In the program operation, for example, the source voltage $V_{SRC}$ is supplied to the bit line BL (FIG. 2) connected to the one whose threshold voltage is to be adjusted among the plurality of selected memory cells MC, and a voltage $V_{DD}$ is supplied to the bit lines BL connected to the one whose threshold voltage is not to be adjusted among the plurality of selected memory cells MC.

As illustrated in FIG. 13, a program voltage $V_{PGM}$ is supplied to the conductive layer 110a that functions as the selected word line WL, a write pass voltage $V_{PASS}$ is supplied to the conductive layers 110a, 110b that function as the unselected word lines WL, a voltage $V_{SGD}$ is supplied to the conductive layers 110a, 110b that function as the drain-side select gate lines SGD, and the ground voltage $V_{SS}$ is supplied to the conductive layers 111 that functions as the source-side select gate lines SGS.

The program voltage $V_{PGM}$ is a voltage of a degree in which the electrons are accumulated in the charge storage layer 132 of the selected memory cell MC, and larger than the above-described read pass voltage $V_{READ}$. The write pass voltage $V_{PASS}$ is a voltage of a degree in which the memory cell MC turns ON regardless of the data recorded in the memory cell MC. The write pass voltage $V_{PASS}$ is equal to or larger than the above-described read pass voltage $V_{READ}$, and smaller than the program voltage $V_{PGM}$. The voltage $V_{SGD}$ is a voltage of a degree in which the drain-side select transistor STD turns ON when the source voltage $V_{SRC}$ is supplied to the bit line BL and the drain-side select transistor STD turns OFF when a predetermined driving voltage is supplied to the bit line BL. The voltage $V_{SGD}$ is larger than the ground voltage $V_{SS}$ and smaller than the above-described voltage $V_{SG}$.

Accordingly, an electron channel that electrically conducts the bit line BL to the channel region of the selected memory cell MC is formed in the semiconductor layer 120. The electrons in the channel region of the selected memory cell MC tunnel through the tunnel insulating layer 131 to be accumulated in the charge storage layer 132.

In Step S103 (FIG. 12), a verify operation is executed.

As illustrated in FIG. 14, the verify operation is basically executed similarly to the read operation. However, in the verify operation, a verify voltage $V_{VFYX}$ (verify voltage $V_{VFYA}$, $V_{VFYB}$, or another verify voltage in FIG. 10), not the read voltage $V_{CGXR}$, is supplied to the conductive layer 110a that functions as the selected word line WL.

In Step S104 (FIG. 12), the result of the verify operation is determined. For example, when a ratio of the memory cells MC detected as the ON state in the verify operation is a certain number or more, it is determined as verify FAIL, and the process proceeds to Step S105. Meanwhile, when the ratio of the memory cells MC detected as the ON state in the verify operation is less than the certain number, it is determined as verify PASS, and the process proceeds to Step S107.

In Step S105, it is determined whether the loop count $n_W$ has reached a predetermined count $N_W$ or not. When the loop count $n_W$ has not reached, the process proceeds to Step S106. When the loop count $n_W$ has reached, the process proceeds to Step S108.

In Step S106, 1 is added to the loop count $n_W$, and the process proceeds to Step S102. In Step S106, for example, a predetermined voltage $\Delta V$ is added to the program voltage $V_{PGM}$. For example, an output voltage of the voltage generation unit vg (FIG. 3) that outputs the program voltage $V_{PGM}$ is increased by the voltage $\Delta V$.

In Step S107, status data indicating that the write sequence is normally terminated is stored in a status register (not illustrated), and the write sequence is terminated.

In Step S108, status data indicating that the write sequence is not normally terminated is stored in the status register (not illustrated), and the write sequence is terminated.

[Single-Sided Erase Sequence]

Figure 15:
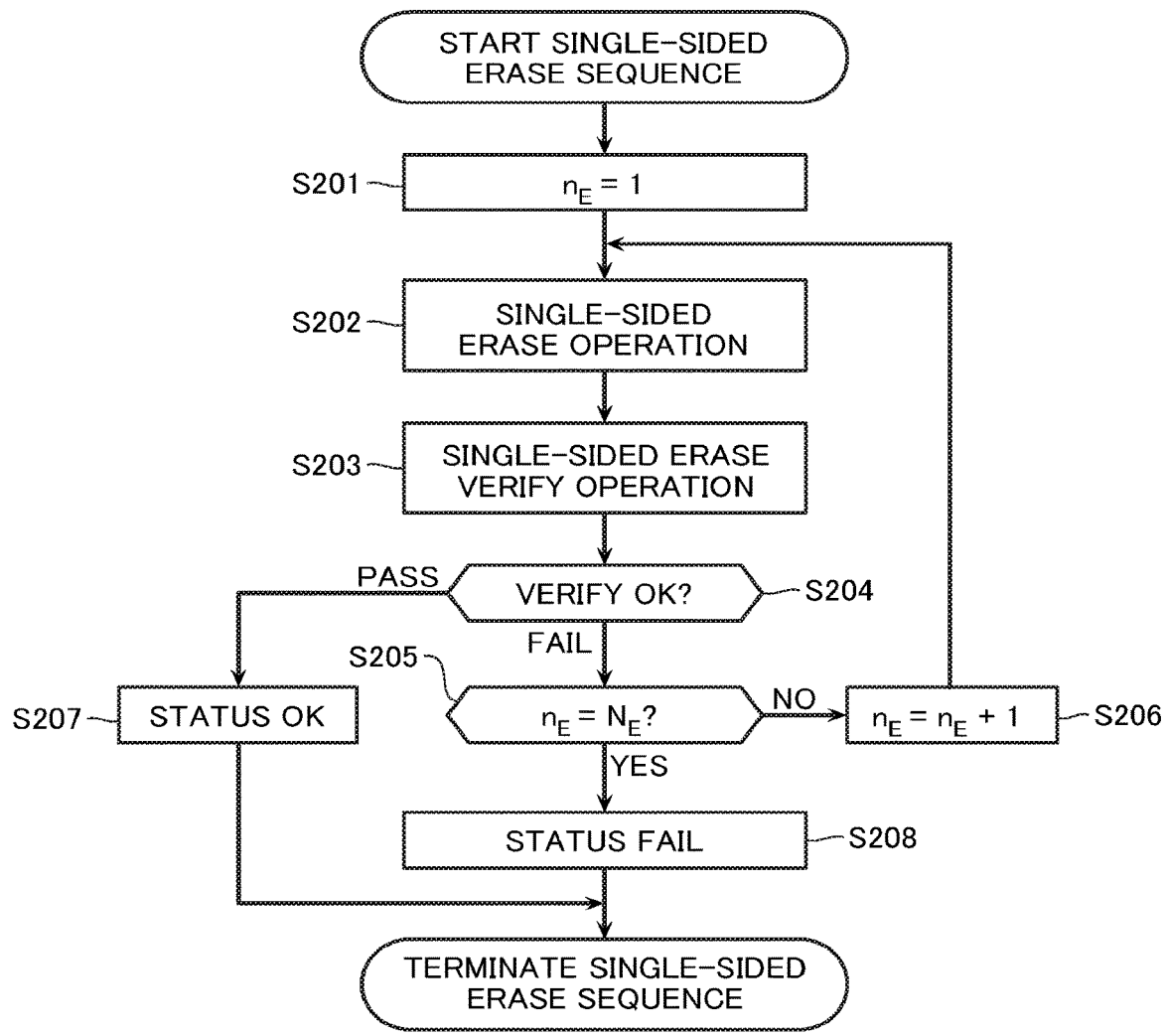
FIG. 15 is a schematic flowchart for describing a single-sided erase sequence of the semiconductor memory device.
Figure 16:
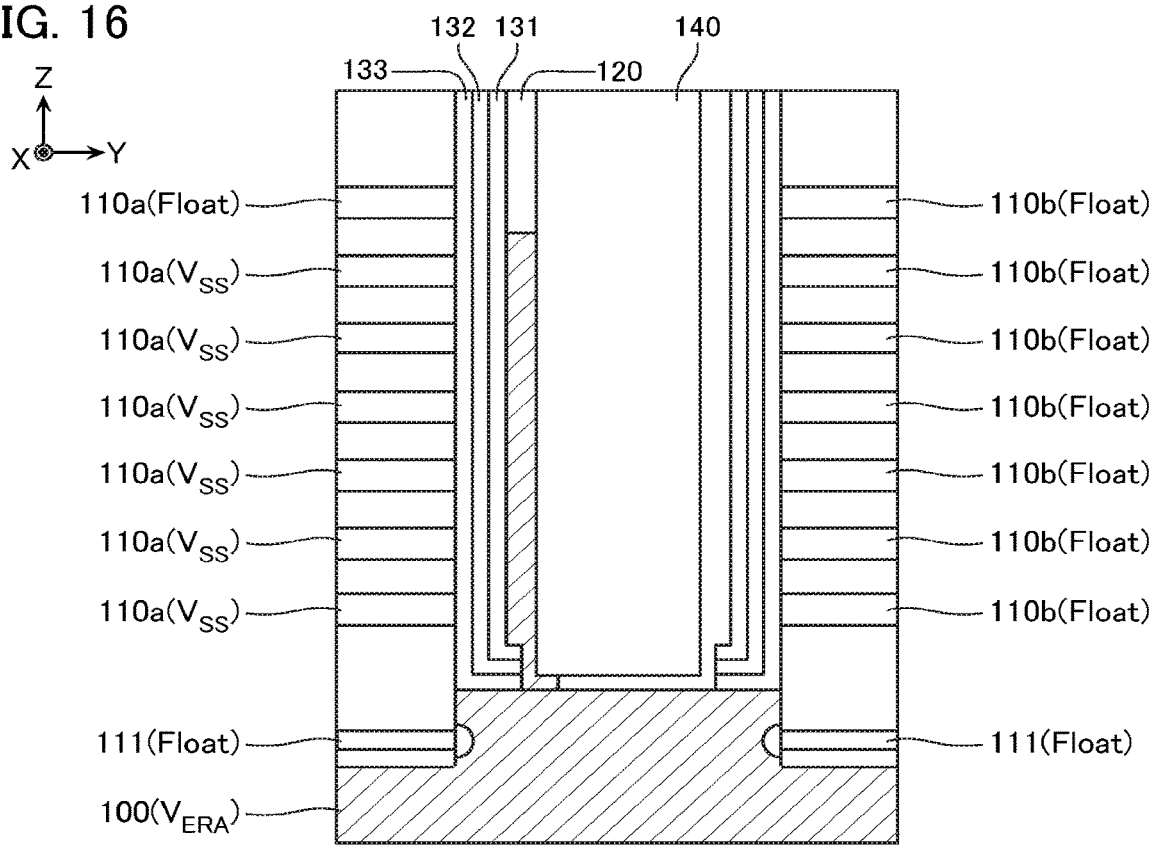
FIG. 16 is a schematic cross-sectional view for describing the single-sided erase sequence of the semiconductor memory device.
Figure 17:
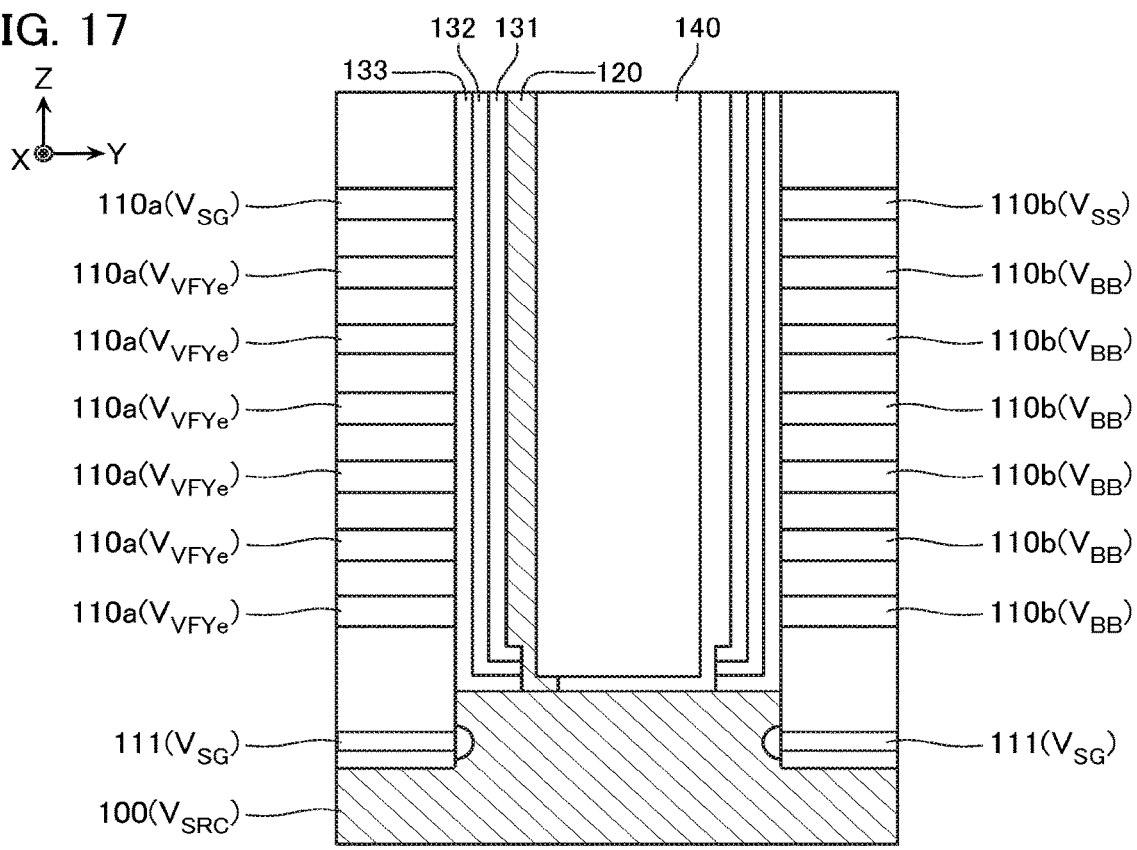
FIG. 17 is a schematic cross-sectional view for describing the single-sided erase sequence of the semiconductor memory device.

Next, with reference to FIG. 15 to FIG. 17, the single-sided erase sequence of the semiconductor memory device according to the embodiment will be described. FIG. 15 is a schematic flowchart for describing the single-sided erase sequence. FIG. 16 and FIG. 17 are schematic cross-sectional views for describing the single-sided erase sequence. The single-sided erase sequence according to the embodiment is collectively executed to all of the memory cells MC that are included in the specified memory block BLK and correspond to the memory strings MSa or all of the memory cells MC that are included in the specified memory block BLK and correspond to the memory strings MSb. Hereinafter, the configuration including a plurality of memory cells MC is referred to as a sub-block in some cases. FIG. 16 and FIG. 17 describe an example in which the single-sided erase sequence is executed to the sub-block corresponding to the memory string MSa.

In Step S201 (FIG. 15), a loop count $n_E$ is set to 1. The loop count $n_E$ is recorded to a register or the like.

In Step S202, a single-sided erase operation is executed.

In the single-sided erase operation, as illustrated in FIG. 16, the ground voltage $V_{SS}$ is supplied to the conductive layers 110a that function as the word lines WL, and the conductive layer 110a that functions as the drain-side select gate line SGD is set to the floating state. The conductive layers 110b that function as the word lines WL and the drain-side select gate line SGD are set to the floating state. The conductive layers 111 that function as the source-side select gate lines SGS are set to the floating state, and an erase voltage $V_{ERA}$ is supplied to the semiconductor substrate 100.

The erase voltage $V_{ERA}$ is a voltage of a degree in which the electrons are extracted from the charge storage layer 132 of the selected memory cell MC. The erase voltage $V_{ERA}$ is equal to or larger than the above-described program voltage $V_{PGM}$.

Accordingly, a hole channel that electrically conducts the source line SL to the channel regions of the memory cells MC in the memory string MSa is formed in the semiconductor layer 120. The electrons of the charge storage layer 132 of the memory cell MC in the memory string MSa are extracted to the channel region of the memory cell MC.

The method for setting the conductive layers 110a, 110b to the floating state is appropriately adjustable.

For example, in the example of FIG. 16, all of the conductive layers 110b are set to the floating state. In this case, for example, it is considered to turn OFF at least one of a plurality of transistors disposed to the current paths in all of the current paths for supplying the voltage to the conductive layers 110b. For example, in the example of FIG. 3, all of the current paths for supplying the voltage to the conductive layers 110b that function as the word lines WLb are all of the current paths between the conductive layers 110b and the voltage generation circuit VG (FIG. 3), and all of the current paths between the conductive layers 110b and the bonding pad electrode P (FIG. 3) to which the ground voltage $V_{SS}$ is supplied.

Here, the plurality of transistors $T_{BLK}$ connected to the signal supply line BLKSEL are disposed to all of the current paths for supplying the voltage to the conductive layers 110b that function as the word lines WLb. Therefore, to turn OFF at least one of the plurality of transistors disposed to the current paths in all of the current paths for supplying the voltage to the conductive layers 110b, for example, the signal supply line BLKSEL (FIG. 3) corresponding to this conductive layer 110b in the row decoder RDb may be set to the "L" state.

For example, the plurality of transistors $T_{WL}$ connected to the plurality of signal supply lines $WLSEL_S$ and the plurality of signal supply lines $WLSEL_U$ are disposed to all of the current paths for supplying the voltage to the conductive layers 110b that function as the word lines WLb. Therefore, to turn OFF at least one of the plurality of transistors disposed to the current paths in all of the current paths for supplying the voltage to the conductive layers 110b, for example, all of the signal supply lines $WLSEL_S$ and signal supply lines $WLSEL_U$ in the row decoder RDb may be set to the "L" state.

For example, the plurality of transistors $T_{DRV}$ connected to the plurality of signal supply lines VSEL are disposed to all of the current paths for supplying the voltage to the conductive layers 110b that function as the word lines WLb. Therefore, to turn OFF at least one of the plurality of transistors disposed to the current paths in all of the current paths for supplying the voltage to the conductive layers 110b, for example, all of the signal supply lines VSEL in the row decoder RDb may be set to the "L" state.

For example, in the example of FIG. 16, the ground voltage $V_{SS}$ is supplied to the conductive layers 110a that function as the word lines WLa, and the conductive layer 110a that functions as the drain-side select gate line SGD is set to the floating state. In this case, for example, it is considered to electrically conduct the conductive layers 110a that function as the word lines WLa to the bonding pad electrode P. In addition, it is considered to turn OFF at least one of the plurality of transistors disposed to the current paths in all of the current paths between the conductive layer 110a that functions as the drain-side select gate line SGD and the voltage generation circuit VG (FIG. 3) and all of the current paths between the conductive layer 110a that functions as the drain-side select gate line SGD and the bonding pad electrode P (FIG. 3) to which the ground voltage $V_{SS}$ is supplied.

In Step S203 (FIG. 15), a single-sided erase verify operation is executed.

In the single-sided erase verify operation, as illustrated in FIG. 17, a verify voltage $V_{VFYe}$ is supplied to the conductive layers 110a that function as the word lines WL, and the voltage $V_{SG}$ is supplied to the conductive layer 110a that functions as the drain-side select gate line SGD. The read blocking voltage $V_{BB}$ is supplied to the conductive layers 110b that function as the word lines WL, and the ground voltage $V_{SS}$ is supplied to the conductive layer 110b that functions as the drain-side select gate line SGD. The voltage $V_{SG}$ is supplied to the conductive layers 111 that function as the source-side select gate lines SGS, and the source voltage $V_{SRC}$ is supplied to the semiconductor substrate 100.

The verify voltage $V_{VFYe}$ is larger than the verify voltage $V_{VFYEP}$ (FIG. 10), and smaller than the read voltage $V_{CGAR}$ (FIG. 10). The verify voltage $V_{VFYe}$ may have the magnitude, for example, approximately the same as the magnitude of the largest threshold voltage included in the threshold distribution of the state Er described with reference to FIG. 10. The verify voltage $V_{VFYe}$ may be, for example, smaller than the ground voltage $V_{SS}$.

In Step S204 (FIG. 15), the result of the single-sided erase verify operation is determined. For example, when a ratio of the memory cells MC detected as the OFF state in the single-sided erase verify operation is a certain number or more, it is determined as single-sided erase verify FAIL, and the process proceeds to Step S205. Meanwhile, when the ratio of the memory cells MC detected as the OFF state in the single-sided erase verify operation is less than the certain number, it is determined as single-sided erase verify PASS, and the process proceeds to Step S207.

In Step S205, it is determined whether the loop count $n_E$ has reached a predetermined count $N_E$ or not. In the case of having not reached, the process proceeds to Step S206. In the case of having reached, the process proceeds to Step S208.

In Step S206, 1 is added to the loop count $n_E$, and the process proceeds to Step S202. In Step S206, for example, a predetermined voltage $\Delta V$ is added to the erase voltage $V_{ERA}$.

In Step S207, status data indicating that the erase sequence is normally terminated is stored in a status register (not illustrated), and the erase sequence is terminated.

In Step S208, status data indicating that the erase sequence is not normally terminated is stored in the status register (not illustrated), and the erase sequence is terminated.

[EP Write Sequence]

As described above, for example, when the read operation (FIG. 11), the verify operation (FIG. 14), or the single-sided erase verify operation (FIG. 17) is executed to the selected memory cell MC in the memory string MSa, the magnitude of the voltage of the bit line BL or the magnitude of the current flowing in the bit line BL is detected, thereby detecting whether the selected memory cell MC is in the ON state or the OFF state.

Here, as described with reference to FIG. 8, the semiconductor layer 120 according to the embodiment has an approximately cylindrical shape. A portion opposing the conductive layers 110a of the semiconductor layer 120 functions as the channel regions of the memory cells MC and the drain-side select transistor STD in the memory string MSa. A portion opposing the conductive layers 110b of the semiconductor layer 120 functions as the channel regions of the memory cells MC and the drain-side select transistor STD in the memory string MSb.

In this structure, for example, when an unselected memory cell MC (hereinafter referred to as a "back surface memory cell MC" in some cases) that corresponds to the same semiconductor layer 120 and is disposed at the same height position as those of a selected memory cell MC turns ON, the bit line BL is electrically conducted to the source line SL via the back surface memory cell MC regardless of whether the selected memory cell MC is in the ON state or the OFF state, thus causing the current to flow in the bit line BL. Therefore, the threshold voltage of the selected memory cell MC fails to be appropriately detected. Accordingly, when the read operation (FIG. 11), the verify operation (FIG. 14), and the single-sided erase verify operation (FIG. 17) are executed, the back surface memory cell MC is preferably turned OFF.

Therefore, in this embodiment, in the read operation (FIG. 11), the verify operation (FIG. 14), and the single-sided erase verify operation (FIG. 17), the read blocking voltage $V_{BB}$ is supplied to the gate electrode of the back surface memory cell MC.

Figure 18:
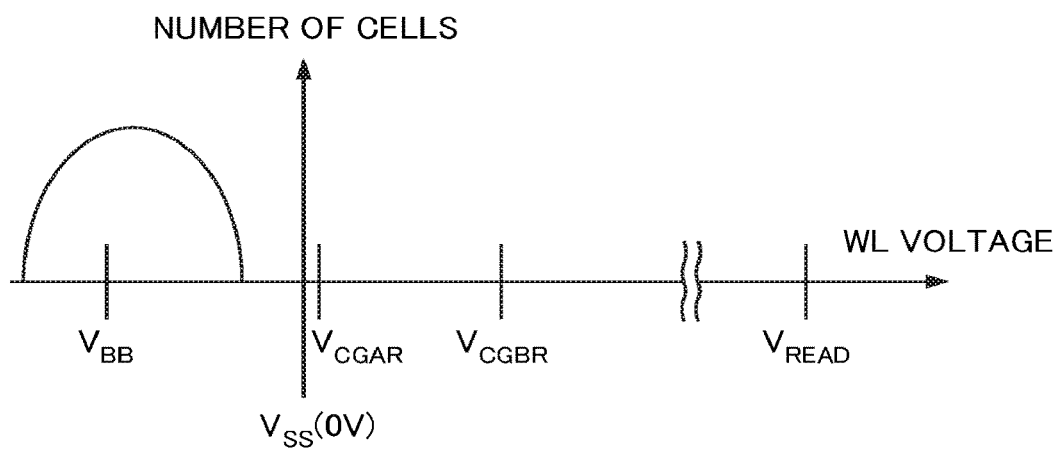
FIG. 18 is a schematic histogram for describing the threshold voltage of the memory cell MC.

However, for example, as illustrated in FIG. 18, immediately after the execution of the single-sided erase sequence, the threshold voltages become smaller than the read blocking voltage $V_{BB}$ in a part of the memory cells MC in some cases. In this state, the back surface memory cell MC possibly fails to be turned OFF.

Figure 19:
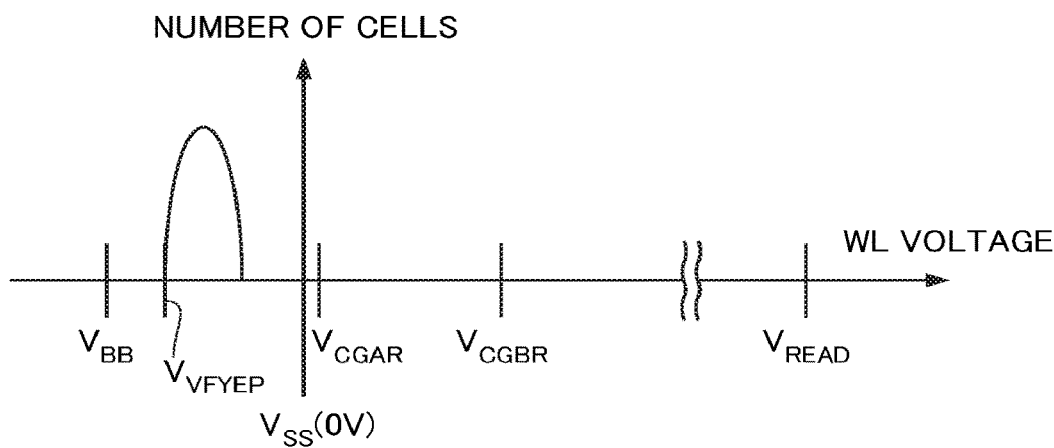
FIG. 19 is a schematic histogram for describing the threshold voltage of the memory cell MC.

Therefore, in the semiconductor memory device according to the embodiment, after the execution of the single-sided erase sequence to a sub-block corresponding to one of the memory strings MSa, MSb, an EP write sequence is executed to the sub-block to which the single-sided erase sequence has been executed before the read operation, the write sequence, or the single-sided erase sequence is executed to a sub-block corresponding to the other. Accordingly, the threshold voltages of the memory cells MC to which the single-sided erase sequence has been executed are controlled to a range larger than the read blocking voltage $V_{BB}$ and smaller than the read voltage $V_{CGAR}$ as illustrated in, for example, FIG. 19.

Figure 20:
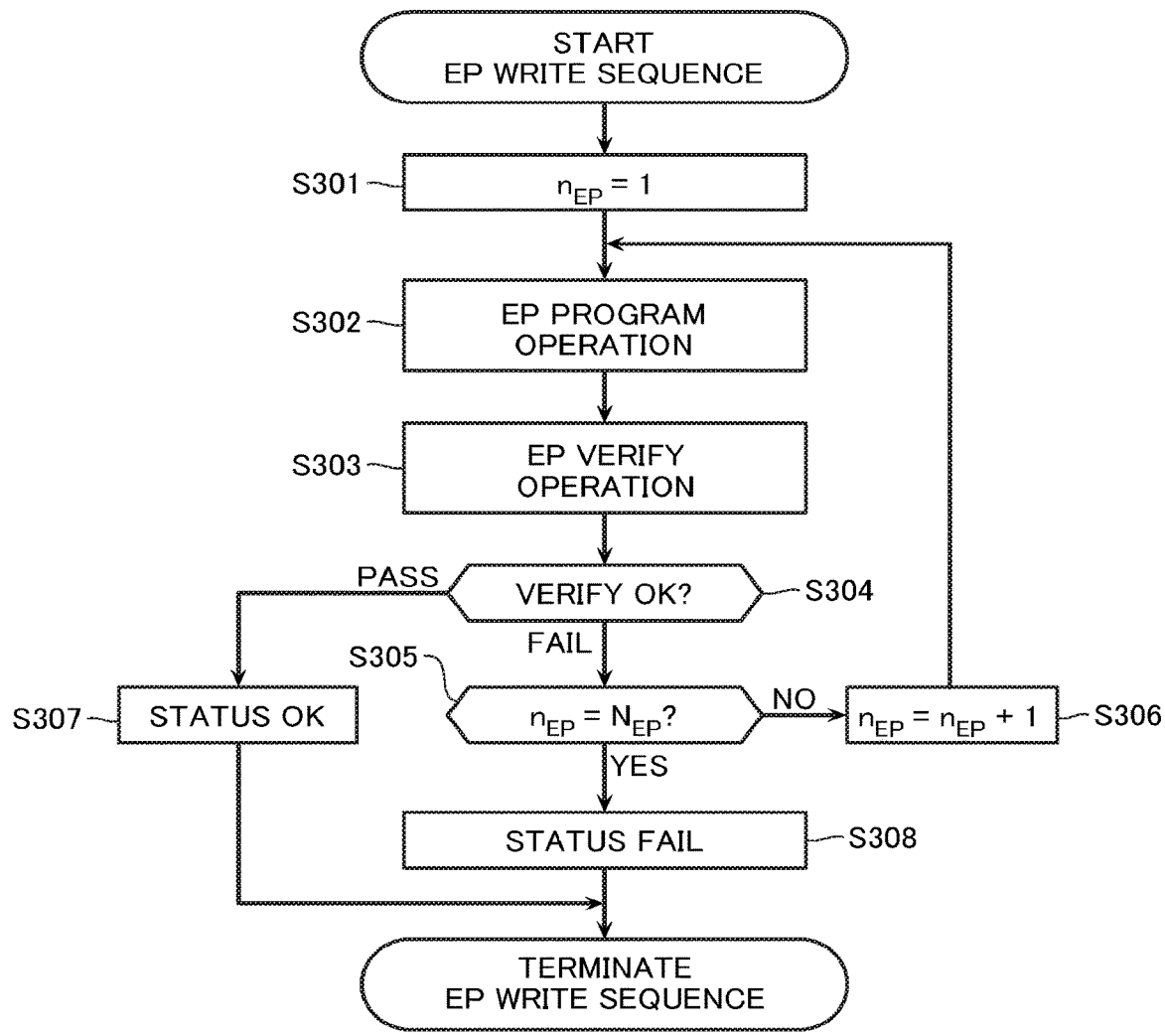
FIG. 20 is a schematic flowchart for describing an EP write sequence of the semiconductor memory device.
Figure 21:
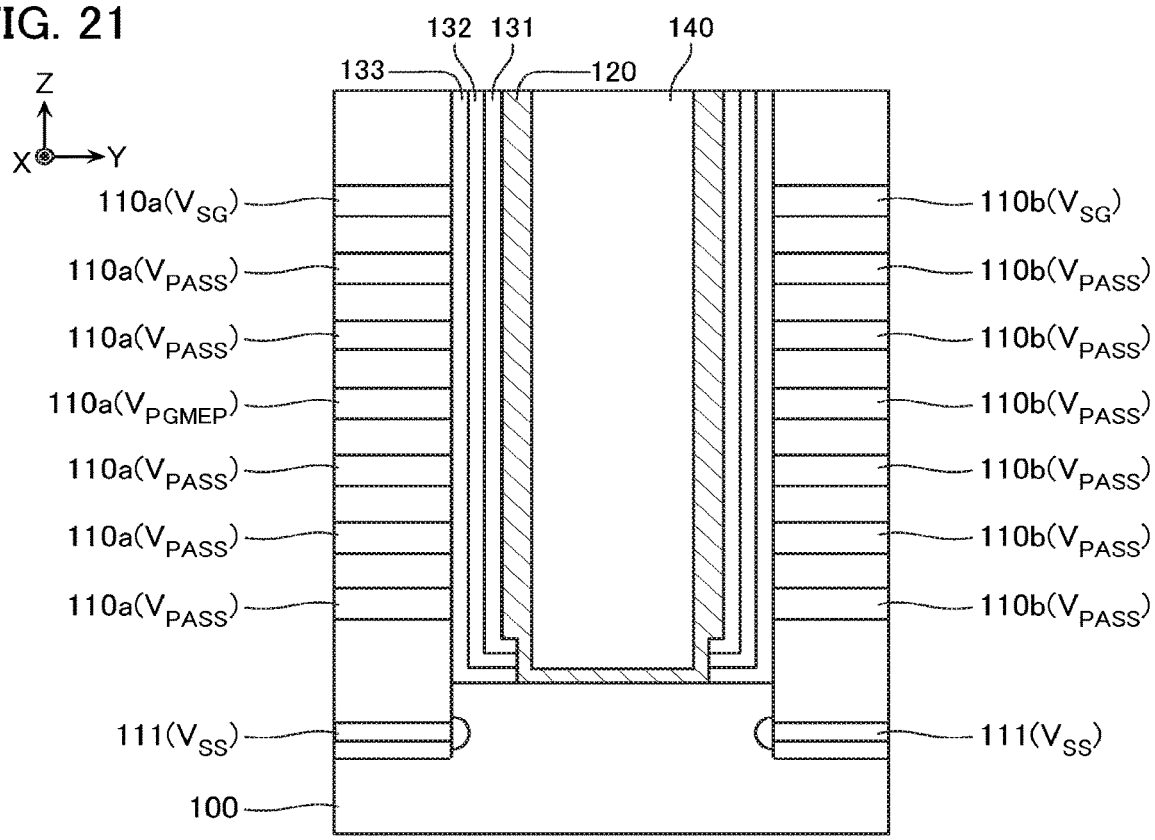
FIG. 21 is a schematic cross-sectional view for describing the EP write sequence of the semiconductor memory device.
Figure 22:
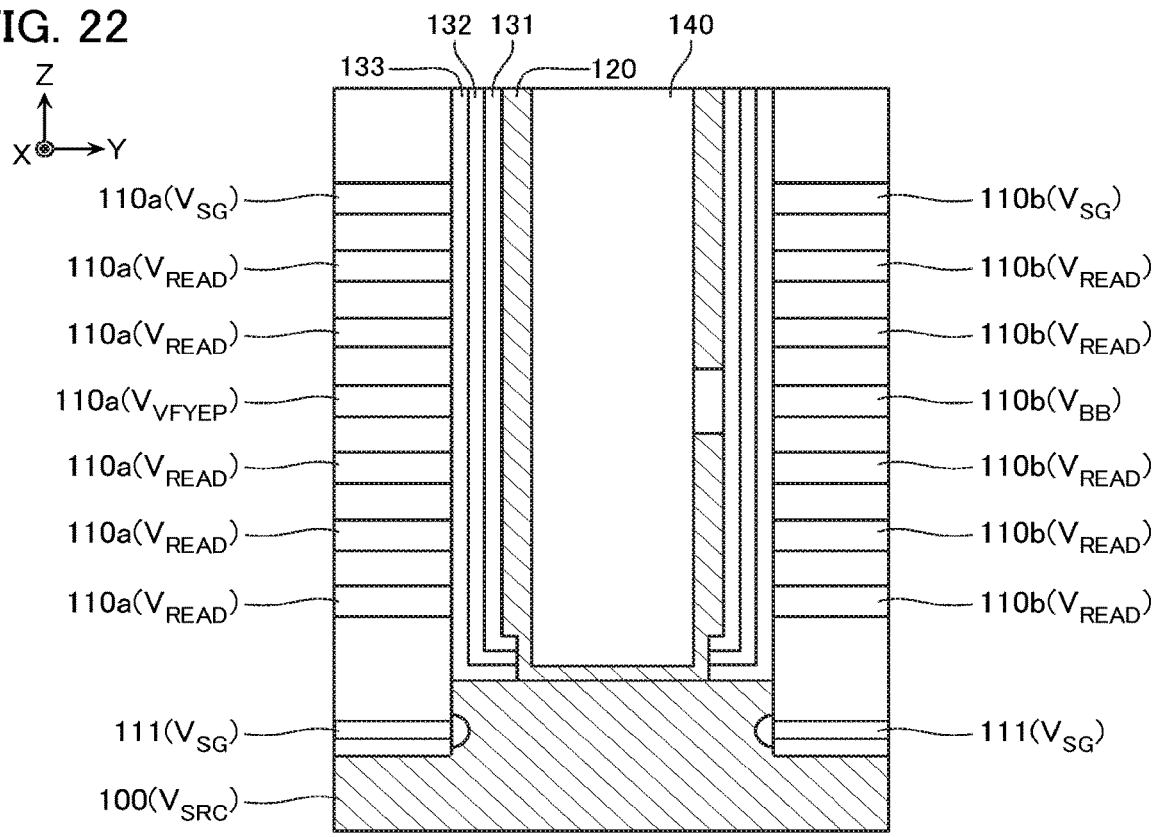
FIG. 22 is a schematic cross-sectional view for describing the EP write sequence of the semiconductor memory device.

Next, with reference to FIG. 20 to FIG. 22, the EP write sequence of the semiconductor memory device according to the embodiment will be described. FIG. 20 is a schematic flowchart for describing the EP write sequence. FIG. 21 and FIG. 22 are schematic cross-sectional views for describing the EP write sequence. The EP write sequence according to the embodiment is collectively executed to the memory cells MC in a specified page. The EP write sequence is executed to all of the pages in the sub-block to which the single-sided erase sequence has been executed after the execution of the single-sided erase sequence to the sub-block corresponding to one of the memory strings MSa, MSb and before the read operation, the write sequence, or the single-sided erase sequence is executed to the sub-block corresponding to the other. FIG. 21 and FIG. 22 describe an example in which the EP write sequence is executed to a predetermined memory cell MC included in the memory string MSa.

In Step S301 (FIG. 20), a loop count $n_{EP}$ is set to 1. The loop count $n_{EP}$ is recorded to a register or the like.

In Step S302, an EP program operation is executed.

In the EP program operation, for example, the source voltage $V_{SRC}$ is supplied to the bit line BL (FIG. 2).

As illustrated in FIG. 21, a program voltage $V_{PGMEP}$ is supplied to the conductive layer 110a that functions as the selected word line WL, the write pass voltage $V_{PASS}$ is supplied to the conductive layers 110a, 110b that function as the unselected word lines WL, the voltage $V_{SG}$ is supplied to the conductive layers 110a, 110b that function as the drain-side select gate lines SGD, and the ground voltage $V_{SS}$ is supplied to the conductive layers 111 that function as the source-side select gate lines SGS.

For example, the program voltage $V_{PGMEP}$ may have the magnitude similar to that of the program voltage $V_{PGM}$, or may be smaller than the program voltage $V_{PGM}$.

In Step S303 (FIG. 20), an EP verify operation is executed.

As illustrated in FIG. 22, the EP verify operation is basically executed similarly to the read operation. However, in the EP verify operation, the verify voltage $V_{VFYEP}$, not the read voltage $V_{CGXR}$, is supplied to the conductive layer 110a that functions as the selected word line WL.

In Step S304 (FIG. 20), the result of the EP verify operation is determined. For example, when a ratio of the memory cells MC detected as the ON state in the EP verify operation is a certain number or more, it is determined as EP verify FAIL, and the process proceeds to Step S305. Meanwhile, when the ratio of the memory cells MC detected as the ON state in the EP verify operation is less than the certain number, it is determined as EP verify PASS, and the process proceeds to Step S307.

In Step S305, it is determined whether the loop count $n_{EP}$ has reached a predetermined count $N_{EP}$ or not. When the loop count $n_{EP}$ has not reached, the process proceeds to Step S306. When the loop count $n_{EP}$ has reached, the process proceeds to Step S308.

In Step S306, 1 is added to the loop count $n_{EP}$, and the process proceeds to Step S302. In Step S306, for example, a predetermined voltage ΔV is added to the program voltage $V_{PGMEP}$.

In Step S307, status data indicating that the EP write sequence is normally terminated is stored in a status register (not illustrated), and the EP write sequence is terminated.

In Step S308, status data indicating that the EP write sequence is not normally terminated is stored in the status register (not illustrated), and the EP write sequence is terminated.

FIRST COMPARATIVE EXAMPLE

Figure 23:
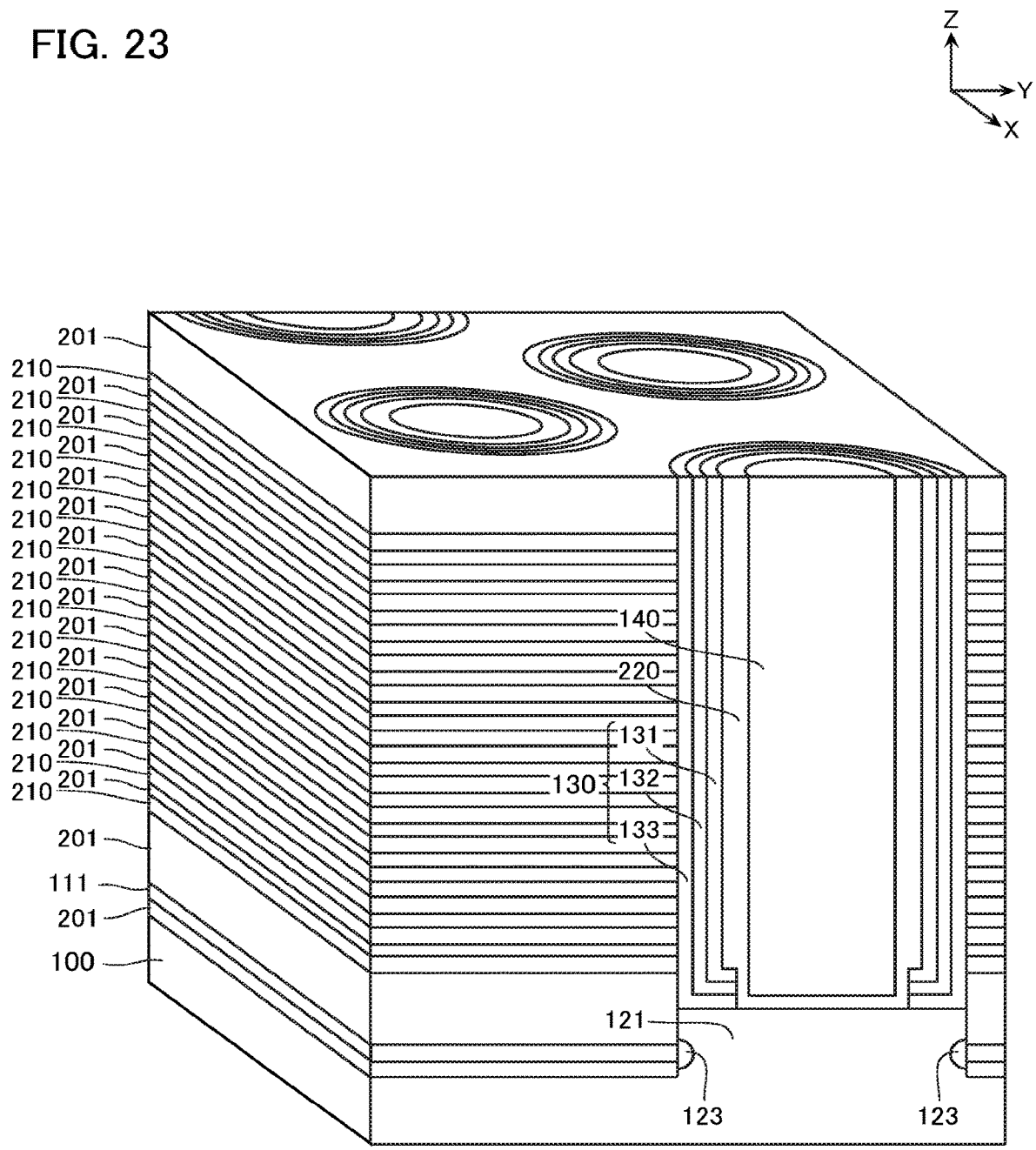
FIG. 23 is a schematic perspective view of a semiconductor memory device according to a first comparative example.

Next, with reference to FIG. 23, a semiconductor memory device according to the first comparative example will be described. FIG. 23 is a schematic perspective view for describing the semiconductor memory device according to the first comparative example.

The semiconductor memory device according to the first comparative example includes a plurality of conductive layers 210 stacked in the Z-direction, a semiconductor layer 220, and a gate insulating layer 130. The semiconductor layer 220 extends in the Z-direction and has an approximately closed-bottomed cylindrical shape. The gate insulating layer 130 is disposed between the plurality of conductive layers 210 and the semiconductor layer 220. Insulating layers 201 of silicon oxide ($SiC_2$) or the like are disposed between the plurality of conductive layers 210.

The conductive layer 210 is different from the conductive layer 110 in that a plurality of through-holes are provided. Inner peripheral surfaces of the plurality of through-holes are each opposed to an outer peripheral surface of the semiconductor layer 220 via the gate insulating layer 130.

SECOND COMPARATIVE EXAMPLE

Figure 24:
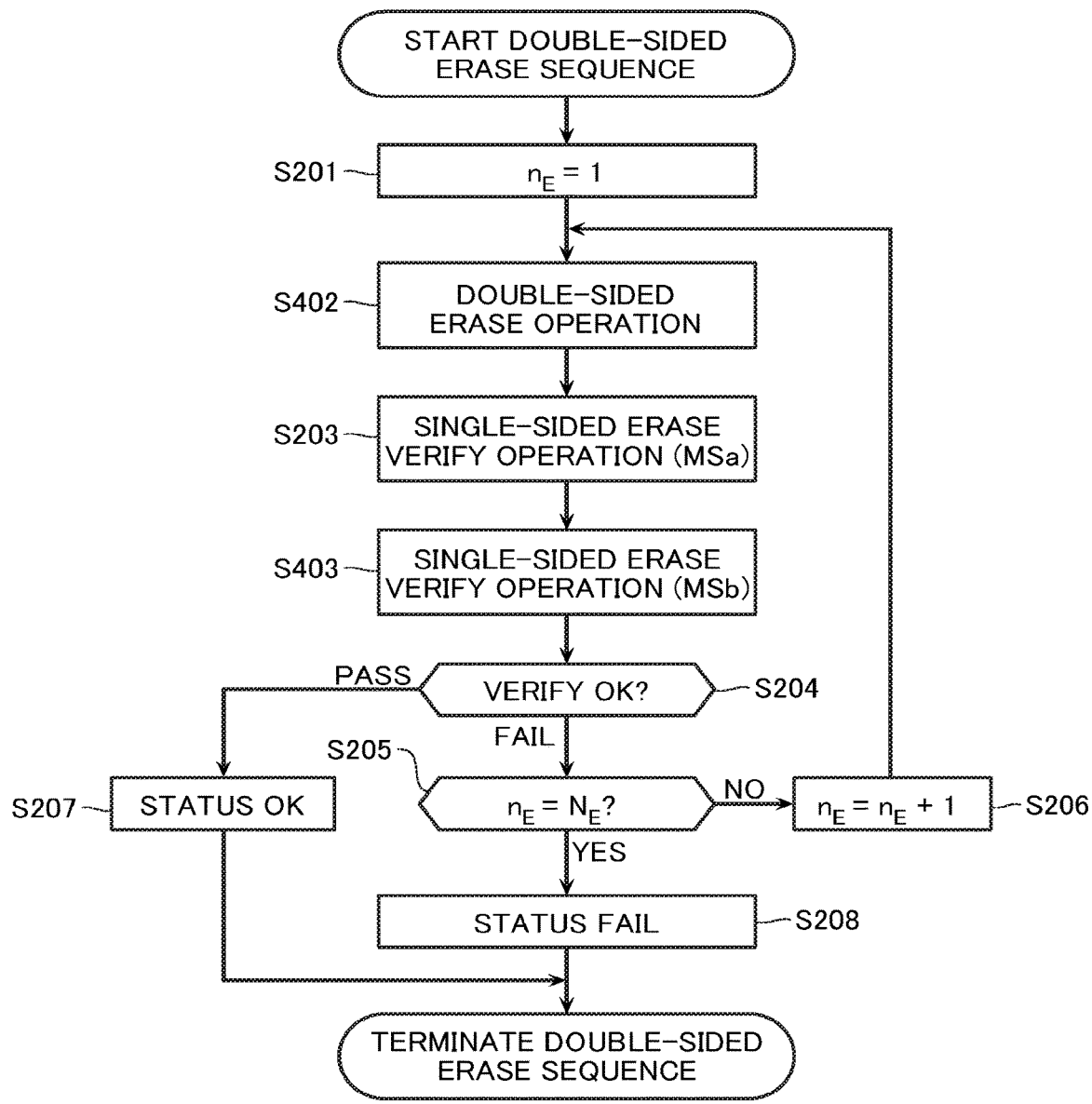
FIG. 24 is a schematic flowchart for describing a double-sided erase sequence of a semiconductor memory device according to a second comparative example.
Figure 25:
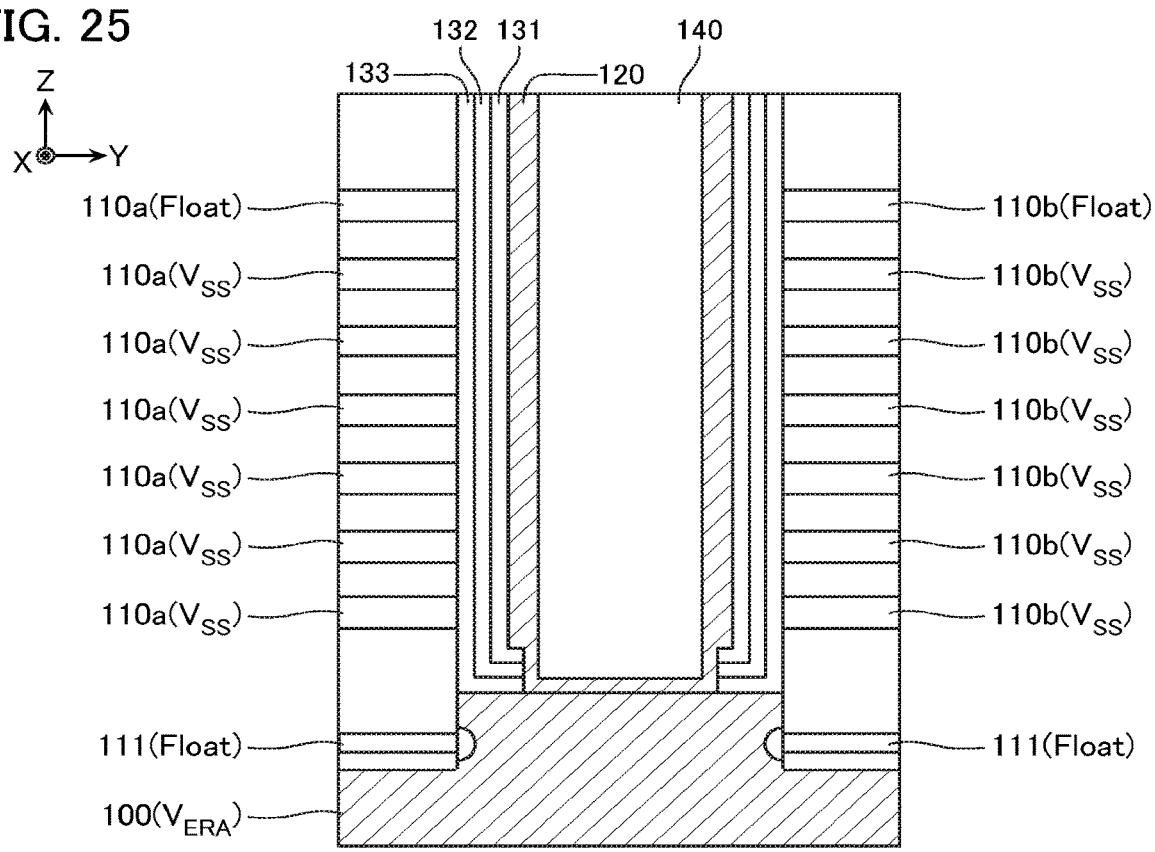
FIG. 25 is a schematic cross-sectional view for describing the double-sided erase sequence of the semiconductor memory device according to the second comparative example.

Next, with reference to FIG. 24 and FIG. 25, a semiconductor memory device according to the second comparative example will be described. FIG. 24 is a schematic flowchart for describing a double-sided erase sequence of the semiconductor memory device according to the second comparative example. FIG. 25 is a schematic cross-sectional view for describing the double-sided erase sequence.

Similarly to the semiconductor memory device according to the first embodiment, the semiconductor memory device according to the second comparative example has the configuration as described with reference to FIG. 5 to FIG. 9. However, the semiconductor memory device according to the second comparative example is configured to execute the double-sided erase sequence instead of the single-sided erase sequence.

The double-sided erase sequence is collectively executed to all of the memory cells MC in a specified memory block BLK.

Step S201 (FIG. 24) is executed similarly to the single-sided erase sequence.

In Step S402, a double-sided erase operation is executed.

In the double-sided erase operation, as illustrated in FIG. 25, the ground voltage $V_{SS}$ is supplied to the conductive layers 110a, 110b that function as the word lines WL, and the conductive layers 110a, 110b that function as the drain-side select gate lines SGD are set to the floating state. The conductive layers 111 that function as the source-side select gate lines SGS are set to the floating state, and an erase voltage $V_{ERA}$ is supplied to the semiconductor substrate 100.

In Step S203, for example, a single-sided erase verify operation is executed to a sub-block corresponding to the memory string MSa.

In Step S403, for example, the single-sided erase verify operation is executed to a sub-block corresponding to the memory string MSb.

Step S204 to Step S208 are executed similarly to the single-sided erase sequence.

THIRD COMPARATIVE EXAMPLE

Figure 26:
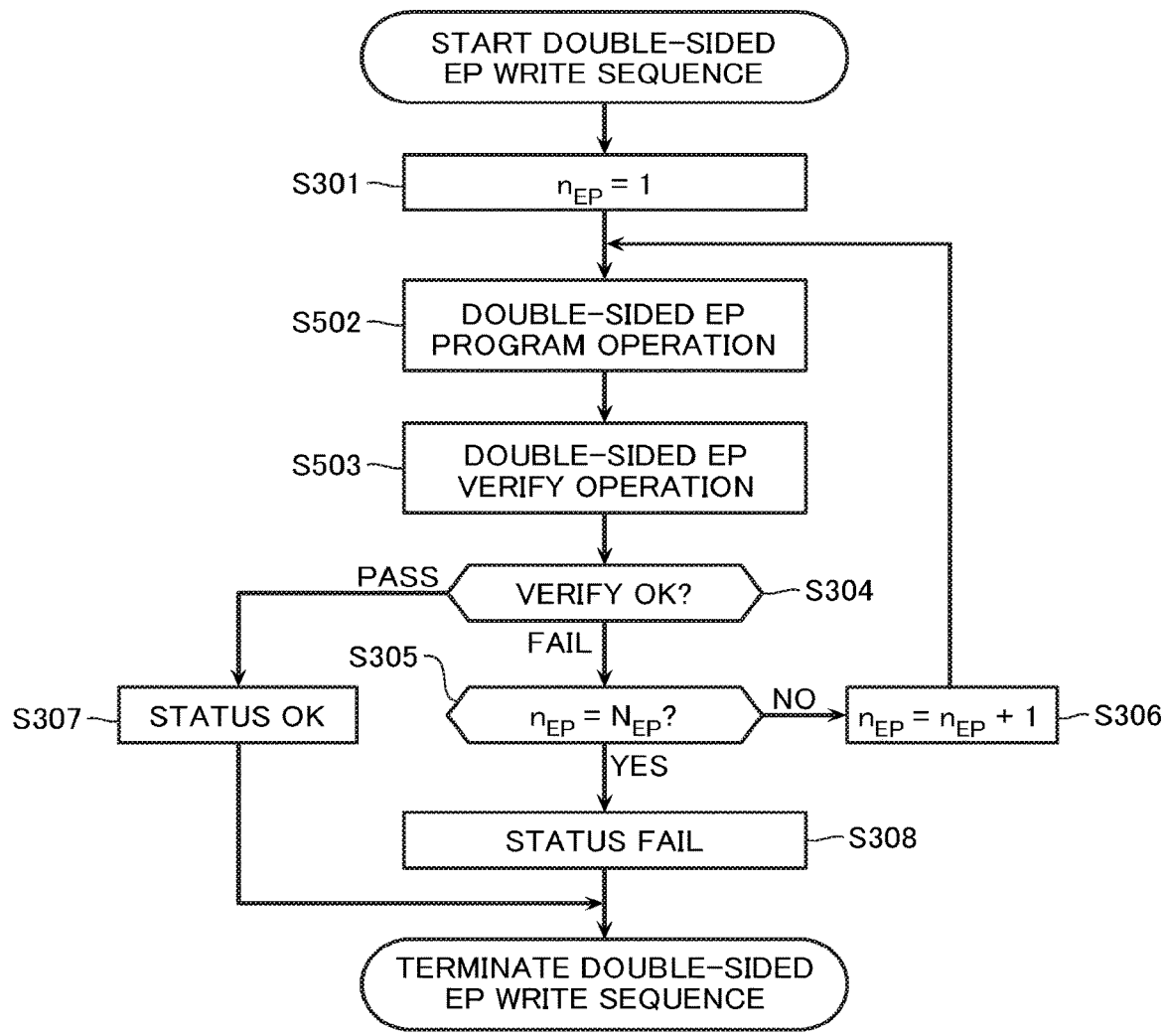
FIG. 26 is a schematic flowchart for describing a double-sided EP write sequence of a semiconductor memory device according to a third comparative example.

Next, with reference to FIG. 26 to FIG. 28, a semiconductor memory device according to the third comparative example will be described. FIG. 26 is a schematic flowchart for describing a double-sided EP write sequence of the semiconductor memory device according to the third comparative example. FIG. 27 and FIG. 28 are schematic cross-sectional views for describing the double-sided EP write sequence.

Similarly to the semiconductor memory device according to the first embodiment, the semiconductor memory device according to the third comparative example has the configuration as described with reference to FIG. 5 to FIG. 9. However, the semiconductor memory device according to the third comparative example is configured to execute the double-sided erase sequence according to the second comparative example instead of the single-sided erase sequence. The semiconductor memory device according to the third comparative example is configured to execute the double-sided EP write sequence.

The double-sided EP write sequence is collectively executed to all of the memory cells MC in a specified memory block BLK.

Step S301 (FIG. 26) is executed similarly to the EP write sequence according to the first embodiment.

In Step S502, a double-sided EP program operation is executed.

In the double-sided EP program operation, for example, the source voltage $V_{SRC}$ is supplied to the bit line BL (FIG. 2).

In the double-sided EP program operation, as illustrated in FIG. 27, the k-th (k is a natural number) conductive layer 110a counting from the lower side and the k-th conductive layer 110b counting from the lower side are set to the selected word lines WL, and the program voltage $V_{PGMEP}$ is supplied to these conductive layers 110a, 110b. The write pass voltage $V_{PASS}$ is supplied to the conductive layers 110a, 110*b* that function as the unselected word lines WL, the voltage $V_{SG}$ is supplied to the conductive layers 110*a*, 110*b* that function as the drain-side select gate lines SGD, and the ground voltage $V_{SS}$ is supplied to the conductive layers 111 that function as the source-side select gate lines SGS.

In Step S503 (FIG. 26), a double-sided EP verify operation is executed.

In the double-sided EP verify operation, as illustrated in FIG. 28, the k-th conductive layer 110*a* counting from the lower side and the k-th conductive layer 110*b* counting from the lower side are set to the selected word lines WL, and the verify voltage $V_{VFYEP}$ is supplied to these conductive layers 110*a*, 110*b*. The read pass voltage $V_{READ}$ is supplied to the conductive layers 110*a*, 110*b* that function as the unselected word lines WL, the voltage $V_{SG}$ is supplied to the conductive layers 110*a*, 110*b* that function as the drain-side select gate lines SGD, the voltage $V_{SG}$ is supplied to the conductive layers 111 that function as the source-side select gate lines SGS, and the source voltage $V_{SRC}$ is supplied to the semiconductor substrate 100.

[Area of Transistor Row CTr]

In the semiconductor memory device according to the first comparative example, for example, as illustrated in FIG. 23, one semiconductor layer 220 is opposed to one conductive layer 210 in the X-Y plane. In this configuration, one memory string is formed corresponding to one semiconductor layer 220. Meanwhile, in the semiconductor memory device according to the second comparative example, for example, as illustrated in FIG. 8, one semiconductor layer 120 is opposed to two conductive layers 110 in the X-Y plane. In this configuration, the two memory strings MSa, MSb are formed corresponding to the one semiconductor layer 120. Therefore, the configuration as illustrated in FIG. 8 allows the high integration of the memory cell array MCA compared with the configuration as illustrated in FIG. 23.

Figure 29:
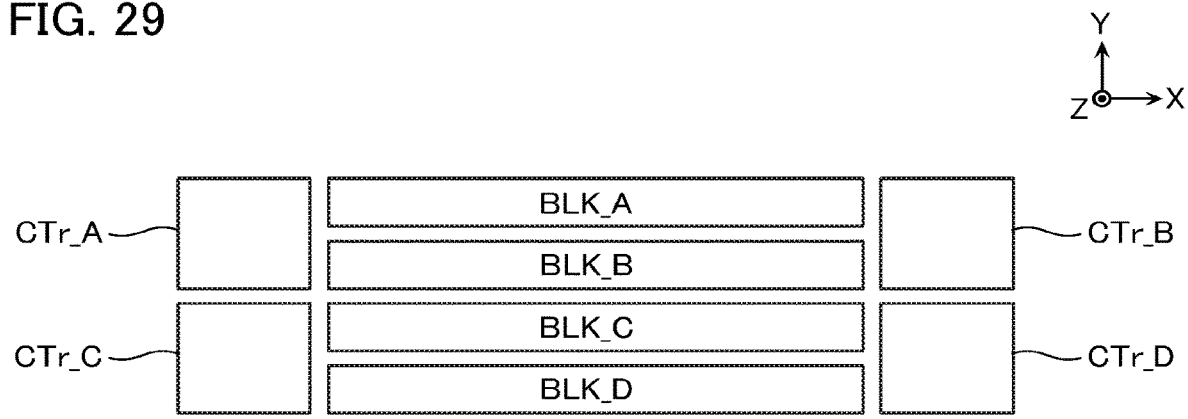
FIG. 29 is a schematic plan view for describing a transistor arrangement.

Here, FIG. 29 illustrates the four memory blocks BLK_A to BLK_D and the four transistor rows CTr_A to CTr_D disposed corresponding to the four memory blocks BLK_A to BLK_D of the semiconductor memory device according to the first comparative example. In the example of FIG. 29, the arrangement period in the Y-direction of the transistor row CTr is double of the arrangement period in the Y-direction of the memory block BLK.

Figure 30:
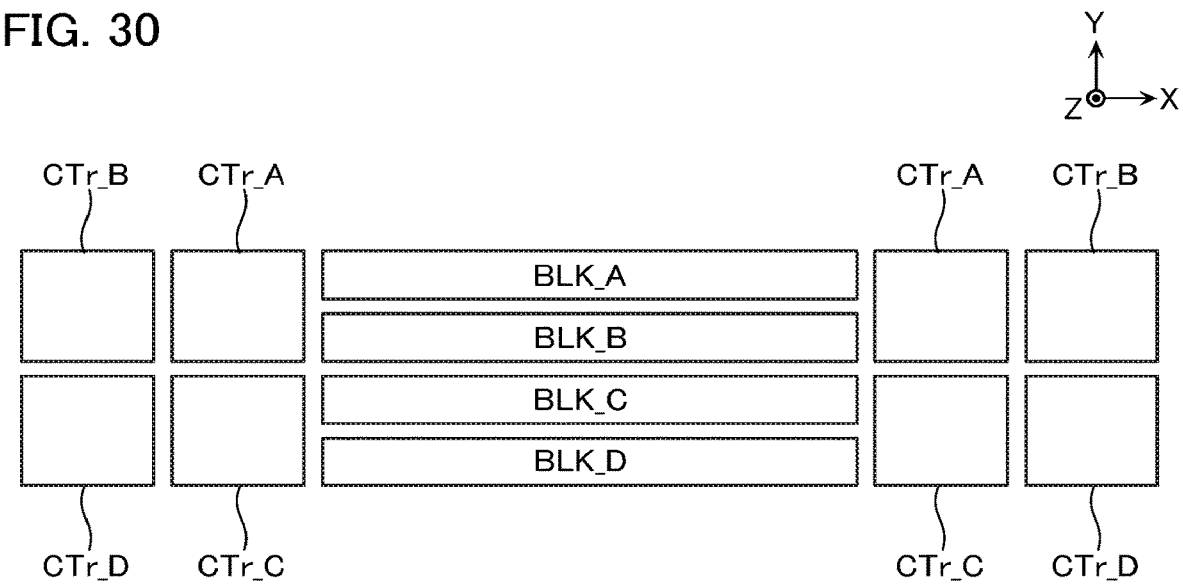
FIG. 30 is a schematic plan view for describing the transistor arrangement.

FIG. 30 illustrates the four memory blocks BLK_A to BLK_D and the four transistor rows CTr_A to CTr_D disposed corresponding to the four memory blocks BLK_A to BLK_D of the semiconductor memory device according to the second comparative example. Here, as described above, the semiconductor memory device according to the second comparative example has the configuration as described with reference to FIG. 5 to FIG. 9. Here, in the configuration as described with reference to FIG. 5 to FIG. 9, it is necessary to dispose the transistor rows CTr for connecting the conductive layers 110*a* to the voltage generation circuit VG in one side in the X-direction with respect to the memory blocks BLK_A to BLK_D and dispose the transistor rows CTr for connecting the conductive layers 110*b* to the voltage generation circuit VG in the other side in the X-direction with respect to the memory blocks BLK_A to BLK_D. Accordingly, for example, as illustrated in FIG. 30, the area in the X-direction of the transistor rows CTr_A to CTr_D becomes double compared with the structure as illustrated in FIG. 29.

Figure 31:
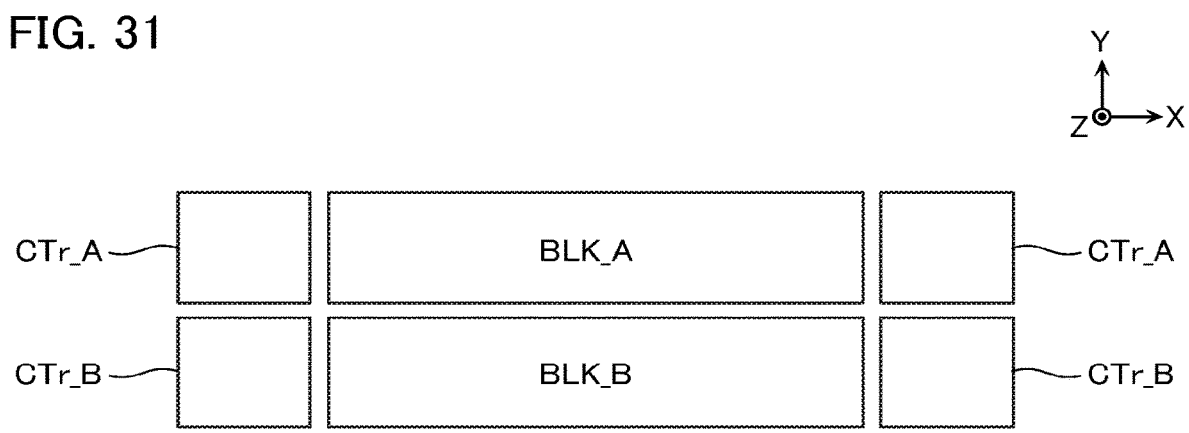
FIG. 31 is a schematic plan view for describing the transistor arrangement.

To reduce the area of the transistor rows CTr_A to CTr_D, for example, as illustrated in FIG. 31, it is considered to make the width in the Y-direction of one memory block BLK double of the width in the Y-direction of the memory block BLK according to the first comparative example.

[Ratio Between Page Size and Block Size]

When the widths in the Y-direction are the approximately same between the memory block BLK according to the second comparative example and the memory block BLK according to the first comparative example, the number of the memory cells MC included in the memory block BLK according to the second comparative example is approximately double of the number of the memory cells MC included in the memory block BLK according to the first comparative example.

When the structure as illustrated in FIG. 31 is employed to reduce the area of the transistor rows CTr_A to CTr_D, the width in the Y-direction of the memory block BLK is approximately double of that in the structure as illustrated in FIG. 30. Accordingly, the number of the memory cells MC included in the memory block BLK is approximately four times of the number of the memory cells MC included in the memory block BLK according to the first comparative example.

Here, as described above, in the semiconductor memory device according to the second comparative example, the double-sided erase sequence is collectively executed to all of the memory cells MC included in the specified memory block BLK. In this case, a ratio between the number of the memory cells MC (hereinafter referred to as a "page size" in some cases) included in the page as an execution unit of the read operation and the write sequence and the number of the memory cells MC (hereinafter referred to as a "block size" in some cases) included in the memory block BLK as an execution unit of the erase sequence is also four times compared with the first comparative example. In this case, the product lifetime of the semiconductor memory device is possibly reduced for the reason that, for example, the number of the write sequence executions necessary for garbage collections significantly increases.

Here, the semiconductor memory device according to the first embodiment is configured to execute the single-sided erase sequence. Here, the number of the memory cells MC included in the sub-block as an execution unit of the single-sided erase sequence is a half of the number of the memory cells MC included in the memory block BLK. Accordingly, the problem described above can be reduced.

[Leak Current of Back Surface Memory Cell MC in Read Operation and the Like]

As described with reference to FIG. 24 and FIG. 25, in the double-sided erase sequence according to the second comparative example, the double-sided erase operation is executed in Step S402, the single-sided erase verify operation (FIG. 17) is executed to the sub-block corresponding to the memory string MSa in Step S203, and the single-sided erase verify operation (FIG. 17) is executed to the sub-block corresponding to the memory string MSb in Step S403.

With this method, for example, when the threshold voltages of all of the memory cells MC in the memory block BLK are larger than the read blocking voltage $V_{BB}$, the threshold voltages of all of the memory cells MC in the memory block BLK can be appropriately decreased to the voltages smaller than the verify voltage $V_{VFYe}$.

However, for example, when the threshold voltage of any of the memory cells MC in the memory block BLK is smaller than the read blocking voltage $V_{BB}$, the threshold voltage of the memory cell MC having this memory cell MC as the back surface memory cell MC cannot be obtained. Therefore, the determination of verify PASS is made even when the threshold voltage of this memory cell MC is larger than the verify voltage $V_{VFYe}$, and the threshold voltages of a part of the memory cells MC become larger than the voltage of the read voltage $V_{CGAR}$ or the like in some cases. This possibly causes a state of erroneous writing.

Here, in the semiconductor memory device according to the third comparative example, for example, the double-sided EP write sequence as described with reference to FIG. 26 to FIG. 28 is executed. With this method, the threshold voltages of the two selected memory cells MC can be surely made larger than the read blocking voltage $V_{BB}$. However, for example, when the threshold voltages of the two selected memory cells MC are significantly different, the threshold voltage of the one selected memory cell MC becomes larger than the voltage of the read voltage $V_{CGAR}$ or the like in some cases. This possibly causes a state of erroneous writing.

Here, in the semiconductor memory device according to the first embodiment, as described above, the EP write sequence is executed to all of the pages in the sub-block to which the single-sided erase sequence has been executed after the execution of the single-sided erase sequence to the sub-block corresponding to one of the memory strings MSa, MSb and before the single-sided erase sequence is executed to the sub-block corresponding to the other. Therefore, the threshold voltages of all of the memory cells MC included in the sub-block corresponding to at least one side of the memory strings MSa, MSb can be made constantly larger than the read blocking voltage $V_{BB}$. Accordingly, the occurrence of the state of erroneous writing as described above can be reduced, thereby allowing appropriately controlling the threshold voltage of the memory cell MC.

Second Embodiment

Figure 32:
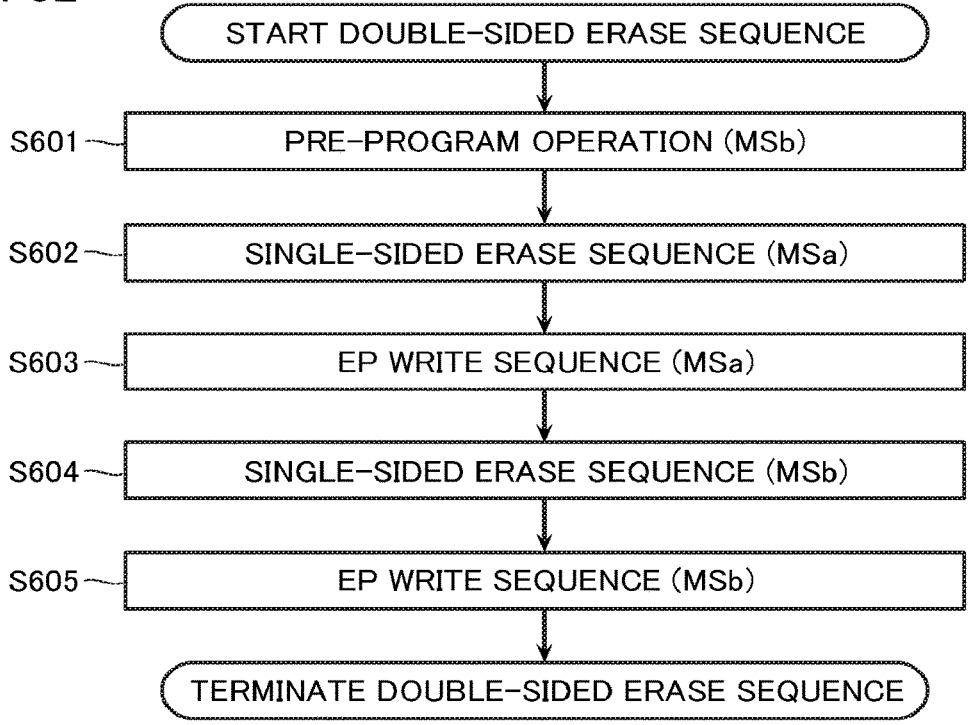
FIG. 32 is a schematic flowchart for describing a double-sided erase sequence of a semiconductor memory device according to a second embodiment.
Figure 33:
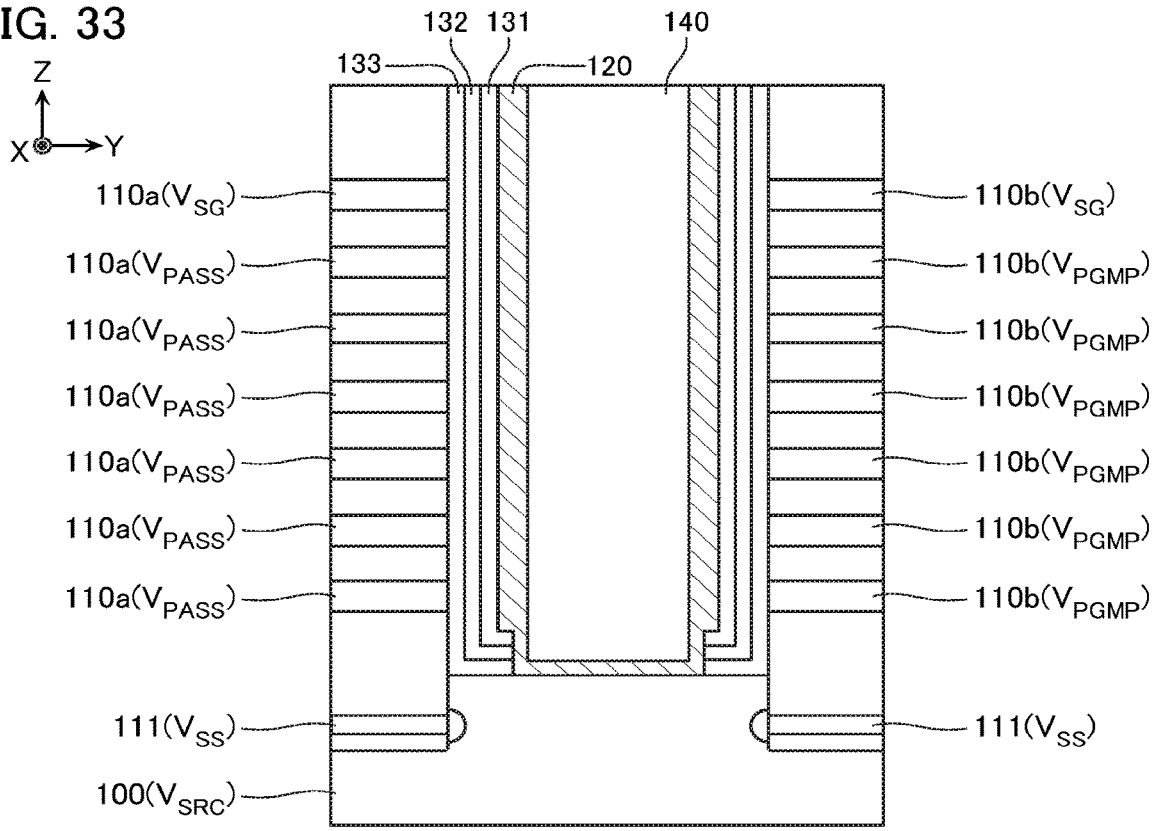
FIG. 33 is a schematic cross-sectional view for describing the double-sided erase sequence of the semiconductor memory device according to the second embodiment.

Next, with reference to FIG. 32 and FIG. 33, a semiconductor memory device according to the second embodiment will be described. FIG. 32 is a schematic flowchart for describing a double-sided erase sequence according to the second embodiment. FIG. 33 is a schematic cross-sectional view for describing the double-sided erase sequence according to the second embodiment.

The semiconductor memory device according to the second embodiment is basically configured similarly to the semiconductor memory device according to the first embodiment. However, the semiconductor memory device according to the second embodiment is configured to execute the double-sided erase sequence according to the second embodiment.

In Step S601 of the double-sided erase sequence according to the embodiment, for example, a pre-program operation is executed to the sub-block corresponding to one of the memory strings MSa, MSb.

In the pre-program operation, for example, the source voltage $V_{SRC}$ is supplied to the bit line BL (FIG. 2).

As illustrated in FIG. 33, the program voltage $V_{PGMP}$ is supplied to the conductive layers 110b that function as the word lines WL, and the voltage $V_{SG}$ is supplied to the conductive layer 110b that functions as the drain-side select gate line SGD. The write pass voltage $V_{PASS}$ is supplied to the conductive layers 110a that function as the word lines WL, and the voltage $V_{SG}$ is supplied to the conductive layer 110a that functions as the drain-side select gate line SGD. The ground voltage $V_{SS}$ is supplied to the conductive layers 111 that function as the source-side select gate lines SGS.

For example, the program voltage $V_{PGMP}$ may have the magnitude similar to that of the program voltage $V_{PGM}$, or may be smaller than the program voltage $V_{PGM}$.

Figure 34:
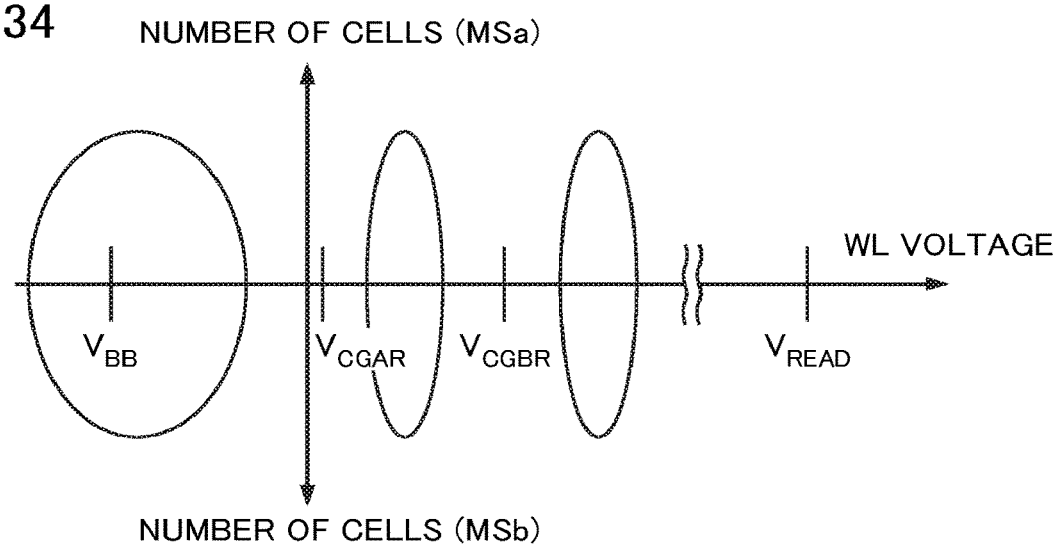
FIG. 34 is a schematic histogram for describing the threshold voltage of the memory cell MC.
Figure 35:
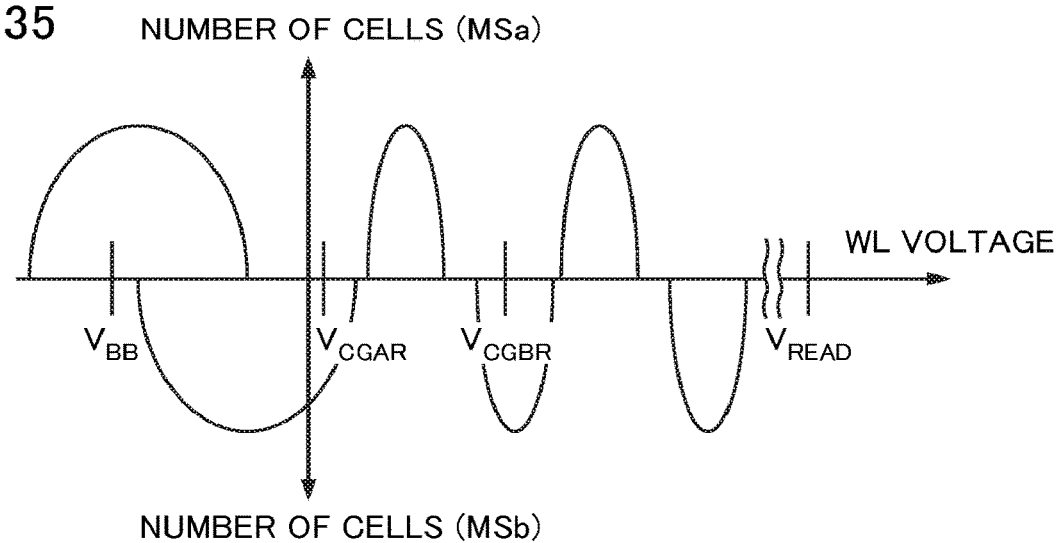
FIG. 35 is a schematic histogram for describing the threshold voltage of the memory cell MC.

For example, FIG. 34 illustrates a histogram when the sub-block corresponding to the memory string MSb includes the memory cells MC having the threshold voltages smaller than the read blocking voltage $V_{BB}$. In this case, by the pre-program operation in Step S601, for example, as illustrated in FIG. 35, the threshold voltages of all of the memory cells MC in the sub-block corresponding to the memory string MSb are controlled to have the magnitudes larger than the read blocking voltage $V_{BB}$.

In Step S602, for example, the single-sided erase sequence described with reference to FIG. 15 to FIG. 17 is executed to the sub-block corresponding to the other of the memory strings MSa, MSb.

Figure 36:
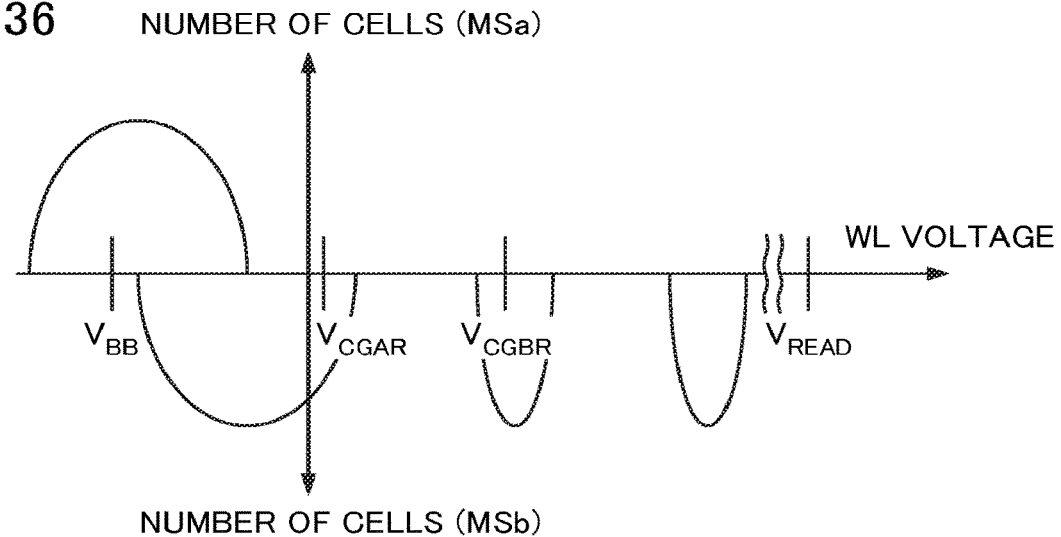
FIG. 36 is a schematic histogram for describing the threshold voltage of the memory cell MC.

Accordingly, for example, as illustrated in FIG. 36, the threshold voltages of all of the memory cells MC in the sub-block corresponding to the memory string MSa are controlled to have the magnitudes smaller than the read voltage $V_{CGAR}$ and the like. In the single-sided erase sequence in Step S602, the single-sided erase verify operation (FIG. 17) is executed. Here, as described above, the threshold voltages of all of the memory cells MC in the sub-block corresponding to the memory string MSb are controlled to have the magnitudes larger than the read blocking voltage $V_{BB}$. Therefore, the single-sided erase verify operation (FIG. 17) is appropriately executed.

In Step S603, for example, the EP write sequence described with reference to FIG. 20 to FIG. 22 is executed to all of the pages in the sub-block corresponding to the other of the memory strings MSa, MSb.

Figure 37:
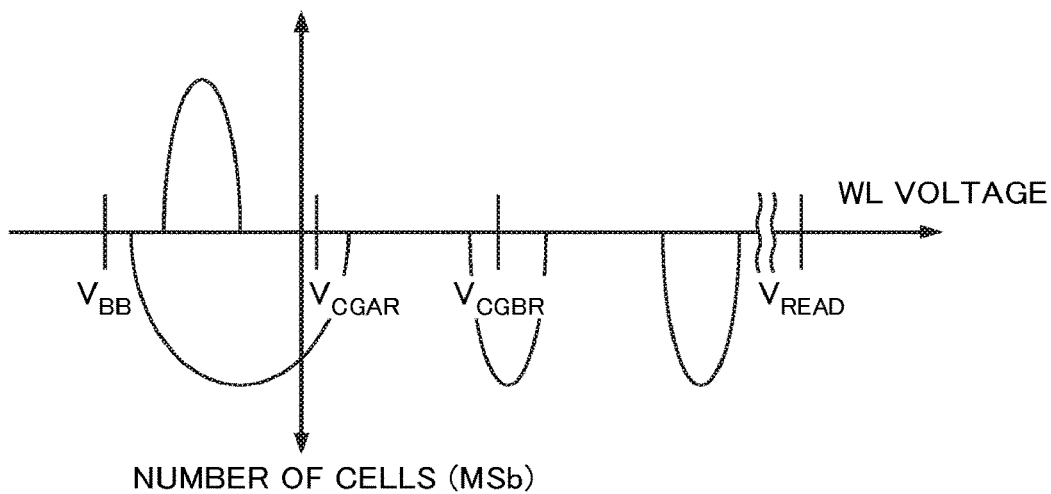
FIG. 37 is a schematic histogram for describing the threshold voltage of the memory cell MC.

Accordingly, for example, as illustrated in FIG. 37, the threshold voltages of all of the memory cells MC in the sub-block corresponding to the memory string MSa are controlled to have the magnitudes smaller than the read voltage $V_{CGAR}$ and the like and larger than the read blocking voltage $V_{BB}$. In the EP write sequence in Step S603, the EP verify operation (FIG. 22) is executed. Here, as described above, the threshold voltages of all of the memory cell MC in the sub-block corresponding to the memory string MSb are controlled to have the magnitudes larger than the read blocking voltage $V_{BB}$. Therefore, the EP verify operation (FIG. 22) is appropriately executed.

In Step S604, for example, the single-sided erase sequence described with reference to FIG. 15 to FIG. 17 is executed to the sub-block corresponding to the one of the memory strings MSa, MSb.

Figure 38:
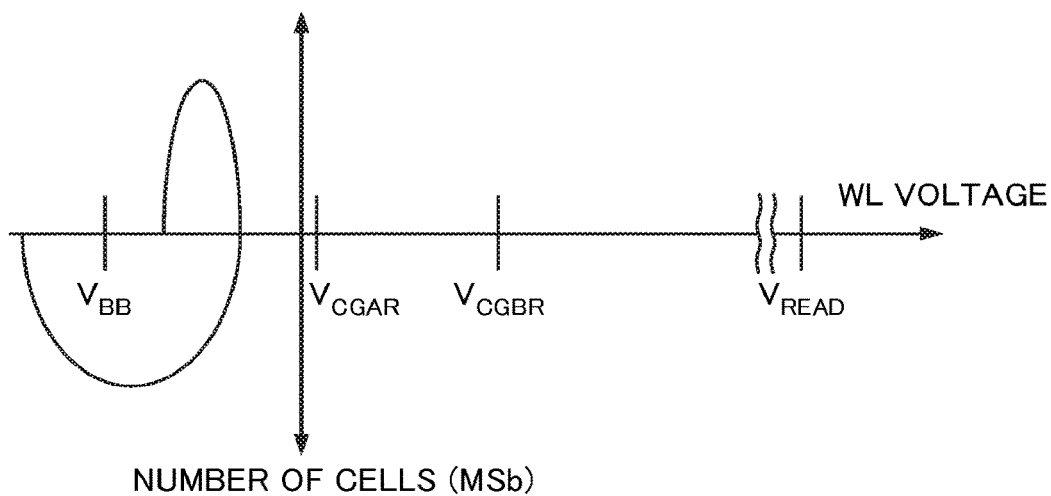
FIG. 38 is a schematic histogram for describing the threshold voltage of the memory cell MC.

Accordingly, for example, as illustrated in FIG. 38, the threshold voltages of all of the memory cells MC in the sub-block corresponding to the memory string MSb are controlled to have the magnitudes smaller than the read voltage $V_{CGAR}$ and the like. In the single-sided erase sequence in Step S604, the single-sided erase verify operation (FIG. 17) is executed. Here, as described above, the threshold voltages of all of the memory cells MC in the sub-block corresponding to the memory string MSa are controlled to have the magnitudes larger than the read blocking voltage $V_{BB}$. Therefore, the single-sided erase verify operation (FIG. 17) is appropriately executed.

In Step S605, for example, the EP write sequence described with reference to FIG. 20 to FIG. 22 is executed to all of the pages in the sub-block corresponding to the one of the memory strings MSa, MSb. Then, the double-sided erase sequence is terminated.

Figure 39:
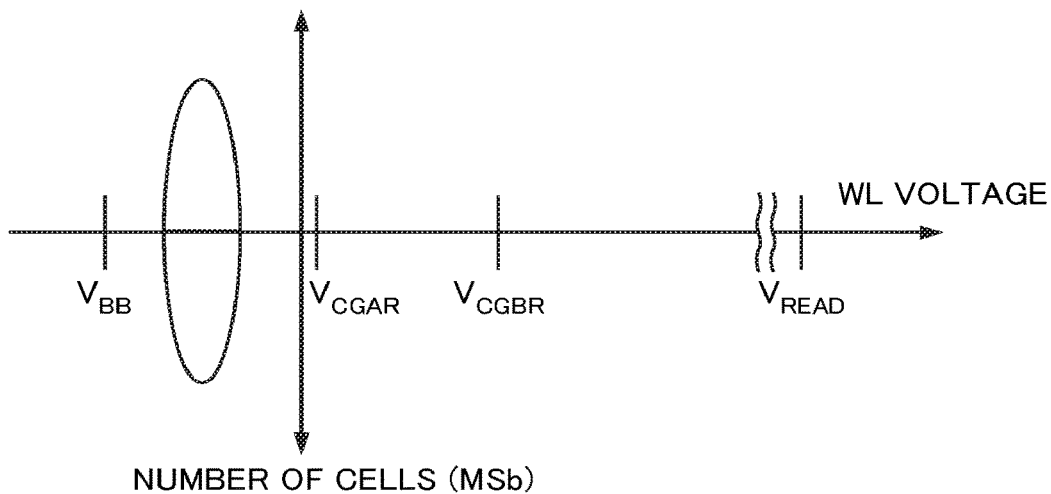
FIG. 39 is a schematic histogram for describing the threshold voltage of the memory cell MC.

Accordingly, for example, as illustrated in FIG. 39, the threshold voltages of all of the memory cells MC in the sub-block corresponding to the memory string MSb are controlled to have the magnitudes smaller than the read voltage $V_{CGAR}$ and the like and larger than the read blocking voltage $V_{BB}$. In the EP write sequence in Step S605, the EP verify operation (FIG. 22) is executed. Here, as described above, the threshold voltages of all of the memory cells MC in the sub-block corresponding to the memory string MSa are controlled to have the magnitudes larger than the read blocking voltage $V_{BB}$. Therefore, the EP verify operation (FIG. 22) is appropriately executed.

For example, the semiconductor memory device according to the second embodiment may be configured to execute the single-sided erase sequence described with reference to FIG. 15 to FIG. 17 alone. For example, the semiconductor memory device according to the second embodiment may be configured to execute the EP write sequence described with reference to FIG. 20 to FIG. 22 alone.

The specific method for executing the double-sided erase sequence according to the embodiment is appropriately adjustable. For example, when the double-sided erase sequence described with reference to FIG. 32 to FIG. 39 has been already executed, it is considered that the threshold voltages of all of the memory cells MC in the memory block BLK are larger than the read blocking voltage $V_{BB}$. In this case, for example, Step S601 may be omitted.

Third Embodiment

Figure 40:
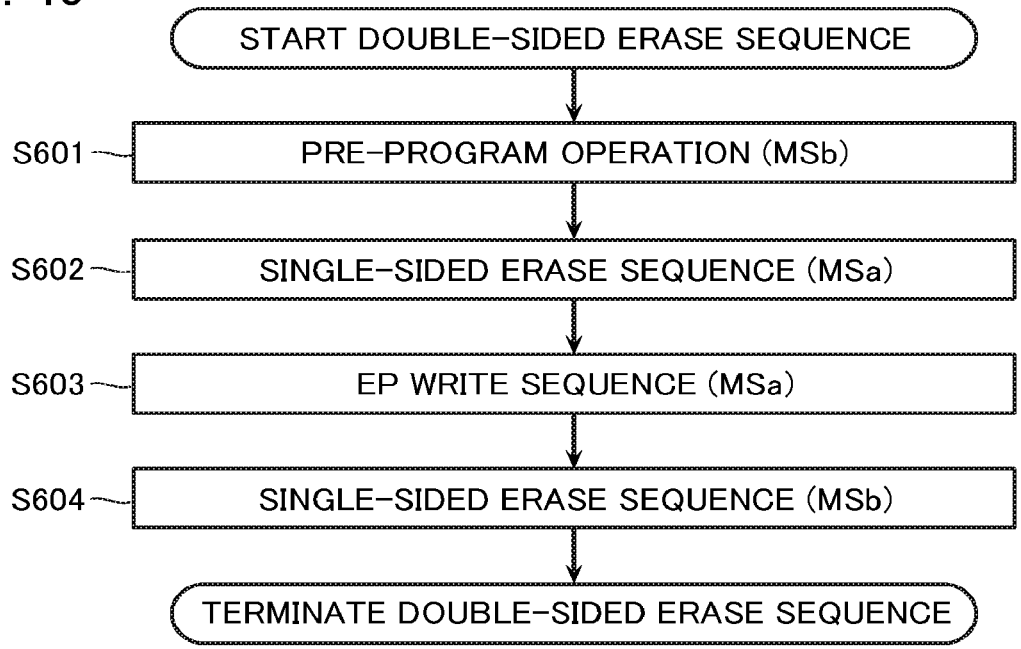
FIG. 40 is a schematic flowchart for describing a double-sided erase sequence of a semiconductor memory device according to a third embodiment.
Figure 41:
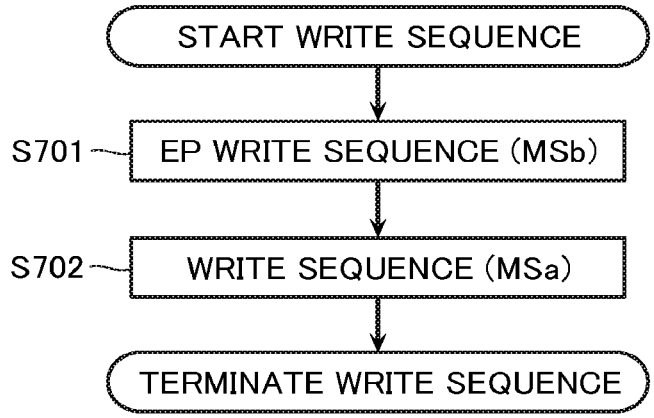
FIG. 41 is a schematic flowchart for describing a write sequence of the semiconductor memory device according to the third embodiment.

Next, with reference to FIG. 40 and FIG. 41, a semiconductor memory device according to the third embodiment will be described. FIG. 40 is a schematic flowchart for describing a double-sided erase sequence according to the third embodiment. FIG. 41 is a schematic flowchart for describing a write sequence according to the third embodiment.

The semiconductor memory device according to the third embodiment is basically configured similarly to the semiconductor memory device according to the second embodiment. However, the semiconductor memory device according to the third embodiment is configured to execute the double-sided erase sequence according to the third embodiment and the write sequence according to the third embodiment.

As illustrated in FIG. 40, the double-sided erase sequence according to the embodiment is basically executed similarly to the double-sided erase sequence according to the second embodiment. However, in the double-sided erase sequence according to the embodiment, Step S605 is not executed.

As illustrated in FIG. 41, in this embodiment, for example, when the write sequence is executed to the page corresponding to the k-th conductive layer 110a counting from the lower side or the k-th conductive layer 110b counting from the lower side, the EP write sequence is executed to the page corresponding to the k-th conductive layer 110b counting from the lower side in Step S701. In addition, the write sequence (FIG. 12 to FIG. 14) according to the first embodiment is executed to the page corresponding to the k-th conductive layer 110a counting from the lower side or the k-th conductive layer 110b counting from the lower side in Step S702 of this write sequence.

Other Embodiments

The semiconductor memory devices according to the first embodiment to the third embodiment are described above. However, the aspects described above are merely examples, and the specific aspects and the like are appropriately adjustable.

For example, in the single-sided erase operation described with reference to FIG. 16, a part of the conductive layers 110a and the conductive layers 110b is set to the floating state. However, this method is merely an example, and the specific method for executing the single-sided erase operation is appropriately adjustable. For example, in the single-sided erase operation to the sub-block corresponding to the word line WLa, the erase voltage $V_{ERA}$ or another voltage may be supplied to the conductive layer 110b that functions as the word line WL. A fixed voltage may be supplied to the conductive layers 110a, 110b that function as the drain-side select gate lines SGD and the conductive layer 111 that functions as the source-side select gate line SGS.

For example, the configuration of the circuit and the like as described with reference to FIG. 3 is appropriately adjustable. For example, FIG. 3 illustrates an example in which a plurality of NMOS transistors are disposed to the current paths between the word line WLa and the voltage generation circuit VG. However, this configuration is merely an example, and the specific configuration is appropriately adjustable. For example, one or a plurality of PMOS transistors may be disposed to the current paths between the word lines WLa, WLb and the voltage generation circuit VG. It is described above that the signal of the gate electrode of the NMOS transistor is set to the "H" state to turn the NMOS transistor ON, and the signal of the gate electrode of the NMOS transistor is set to the "L" state to turn the NMOS transistor OFF. However, when the one or the plurality of PMOS transistors are disposed to the current paths between the word lines WLa, WLb and the voltage generation circuit VG, the signal of the gate electrode of the NMOS transistor may be set to the "L" state to turn the PMOS transistor ON, and the signal of the gate electrode of the NMOS transistor may be set to the "H" state to turn the PMOS transistor OFF.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of first conductive layers arranged in a first direction and extending in a second direction intersecting with the first direction;
    a plurality of second conductive layers spaced from the plurality of first conductive layers in a third direction intersecting with the first direction and the second direction, the plurality of second conductive layers being arranged in the first direction and extending in the second direction;
    a first semiconductor layer disposed between the plurality of first conductive layers and the plurality of second conductive layers, the first semiconductor layer extending in the first direction and opposing the plurality of first conductive layers and the plurality of second conductive layers;
    a charge storage layer that includes a first part and a second part, the first part being disposed between the plurality of first conductive layers and the first semiconductor layer, and the second part being disposed between the plurality of second conductive layers and the first semiconductor layer;

an insulating layer disposed between the plurality of first conductive layers and the plurality of second conductive layers, the insulating layer extending in the first direction and arranged with the first semiconductor layer in the second direction;
a first wiring electrically connected to the first semiconductor layer;
a plurality of voltage supply lines that supplies a voltage to at least one side of the plurality of first conductive layers or the plurality of second conductive layers;
a plurality of first current paths disposed between the plurality of first conductive layers and the plurality of voltage supply lines, the plurality of first current paths each including a first transistor; and
a plurality of second current paths disposed between the plurality of second conductive layers and the plurality of voltage supply lines, the plurality of second current paths each including a second transistor, wherein
the semiconductor memory device is configured to execute a first erase operation that supplies a first voltage to at least a part of the plurality of first conductive layers, supplies an erase voltage larger than the first voltage to the first wiring, and supplies a first signal voltage to at least one of gate electrodes of the second transistors on the second current paths corresponding to at least a part of the plurality of second conductive layers, and the first signal voltage turns the second transistors OFF.

2. The semiconductor memory device according to claim 1, wherein
the semiconductor memory device is configured to execute a second erase operation that supplies the first voltage to at least a part of the plurality of second conductive layers, supplies the erase voltage to the first wiring, and supplies a second signal voltage to at least one of gate electrodes of the first transistors on the first current paths corresponding to at least a part of the plurality of first conductive layers, and the second signal voltage turns the first transistors OFF.

3. The semiconductor memory device according to claim 2, wherein
the semiconductor memory device is configured to execute a first program operation that supplies a first program voltage larger than the first voltage to one of the plurality of first conductive layers and supplies a write pass voltage to another of the plurality of first conductive layers, and the write pass voltage is larger than the first voltage and smaller than the first program voltage, and
the semiconductor memory device executes the first program operation to at least a part of the plurality of first conductive layers after the execution of the first erase operation and before the execution of the second erase operation.

4. The semiconductor memory device according to claim 3, wherein the semiconductor memory device is configured to execute:
a first verify operation that supplies a first verify voltage smaller than the write pass voltage to at least a part of the plurality of first conductive layers, and supplies a third voltage smaller than the first voltage to at least a part of the plurality of second conductive layers; and
a second verify operation that supplies a second verify voltage to one of the plurality of first conductive layers, supplies a read pass voltage to another of the plurality of first conductive layers, and supplies the third voltage to at least one of the plurality of second conductive layers, the second verify voltage being larger than the third voltage and smaller than the first voltage, the read pass voltage being larger than the first voltage and smaller than the first program voltage, wherein
the semiconductor memory device executes the first verify operation after the execution of the first erase operation and before the execution of the first program operation, and
the semiconductor memory device executes the second verify operation after the execution of the first program operation and before the execution of the second erase operation.

5. The semiconductor memory device according to claim 4, wherein
the semiconductor memory device alternately executes the first erase operation and the first verify operation for multiple times, and
the semiconductor memory device alternately executes the first program operation and the second verify operation for multiple times.

6. The semiconductor memory device according to claim 3, wherein
the semiconductor memory device is configured to execute a second program operation that supplies a second program voltage larger than the write pass voltage to one of the plurality of second conductive layers, and supplies the write pass voltage to another of the plurality of second conductive layers, and
the semiconductor memory device executes the second program operation to at least a part of the plurality of second conductive layers after the execution of the second erase operation.

7. The semiconductor memory device according to claim 6, wherein the semiconductor memory device is configured to execute:
a third verify operation that supplies a third verify voltage smaller than the write pass voltage to at least a part of the plurality of second conductive layers, and supplies a third voltage smaller than the first voltage to at least a part of the plurality of first conductive layers; and
a fourth verify operation that supplies a fourth verify voltage to one of the plurality of second conductive layers, supplies a read pass voltage to another of the plurality of second conductive layers, and supplies the third voltage to at least one of the plurality of first conductive layers, the fourth verify voltage being larger than the third voltage and smaller than the first voltage, the read pass voltage being larger than
the first voltage and smaller than the second program voltage, wherein the semiconductor memory device executes the third verify operation after the execution of the second erase operation and before the execution of the second program operation, and
the semiconductor memory device executes the fourth verify operation after the execution of the second program operation.

8. The semiconductor memory device according to claim 7, wherein
the semiconductor memory device alternately executes the second erase operation and the third verify operation for multiple times, and
the semiconductor memory device alternately executes the second program operation and the fourth verify operation for multiple times.

9. The semiconductor memory device according to claim 3, wherein the semiconductor memory device is configured to execute a third program operation that supplies a third program voltage larger than the write pass voltage to at least a part of the plurality of second conductive layers, and the semiconductor memory device executes the third program operation before the execution of the first erase operation.

10. A semiconductor memory device comprising:
a plurality of first conductive layers arranged in a first direction and extending in a second direction intersecting with the first direction;
a plurality of second conductive layers spaced from the plurality of first conductive layers in a third direction intersecting with the first direction and the second direction, the plurality of second conductive layers being arranged in the first direction and extending in the second direction;
a first semiconductor layer disposed between the plurality of first conductive layers and the plurality of second conductive layers, the first semiconductor layer extending in the first direction and opposing the plurality of first conductive layers and the plurality of second conductive layers;
a charge storage layer that includes a first part and a second part, the first part being disposed between the plurality of first conductive layers and the first semiconductor layer, and the second part being disposed between the plurality of second conductive layers and the first semiconductor layer;
an insulating layer disposed between the plurality of first conductive layers and the plurality of second conductive layers, the insulating layer extending in the first direction and arranged with the first semiconductor layer in the second direction;
a first wiring electrically connected to the first semiconductor layer, wherein
the semiconductor memory device is configured to execute:
  a first erase operation that supplies a first voltage to at least a part of the plurality of first conductive layers, supplies a second voltage larger than the first voltage to at least a part of the plurality of second conductive layers, and supplies an erase voltage larger than the first voltage to the first wiring;
  a second erase operation that supplies the first voltage to at least a part of the plurality of second conductive layers, supplies the second voltage to at least a part of the plurality of first conductive layers, and supplies the erase voltage to the first wiring; and
  a first program operation that supplies a first program voltage larger than the first voltage to one of the plurality of first conductive layers and supplies a write pass voltage to another of the plurality of first conductive layers, the write pass voltage being larger than the first voltage and smaller than the first program voltage, wherein the semiconductor memory device executes the first program operation to at least a part of the plurality of first conductive layers after the execution of the first erase operation and before the execution of the second erase operation.

11. The semiconductor memory device according to claim 10, wherein
the second voltage is equal to the erase voltage.

12. The semiconductor memory device according to claim 10, wherein the semiconductor memory device is configured to execute:
  a first verify operation that supplies a first verify voltage smaller than the write pass voltage to at least a part of the plurality of first conductive layers, and supplies a third voltage smaller than the first voltage to at least a part of the plurality of second conductive layers; and
  a second verify operation that supplies a second verify voltage to one of the plurality of first conductive layers, supplies a read pass voltage to another of the plurality of first conductive layers, and supplies the third voltage to at least one of the plurality of second conductive layers, the second verify voltage being larger than the third voltage and smaller than the first voltage, the read pass voltage being larger than the first voltage and smaller than the first program voltage, wherein
the semiconductor memory device executes the first verify operation after the execution of the first erase operation and before the execution of the first program operation, and
the semiconductor memory device executes the second verify operation after the execution of the first program operation and before the execution of the second erase operation.

13. The semiconductor memory device according to claim 12, wherein
the semiconductor memory device alternately executes the first erase operation and the first verify operation for multiple times, and
the semiconductor memory device alternately executes the first program operation and the second verify operation for multiple times.

14. The semiconductor memory device according to claim 10, wherein
the semiconductor memory device is configured to execute a second program operation that supplies a second program voltage larger than the write pass voltage to one of the plurality of second conductive layers, and supplies the write pass voltage to another of the plurality of second conductive layers, and
the semiconductor memory device executes the second program operation to at least a part of the plurality of second conductive layers after the execution of the second erase operation.

15. The semiconductor memory device according to claim 14, wherein
the semiconductor memory device is configured to execute:
  a third verify operation that supplies a third verify voltage smaller than the write pass voltage to at least a part of the plurality of second conductive layers, and supplies a third voltage smaller than the first voltage to at least a part of the plurality of first conductive layers; and
  a fourth verify operation that supplies a fourth verify voltage to one of the plurality of second conductive layers, supplies a read pass voltage to another of the plurality of second conductive layers, and supplies the third voltage to at least one of the plurality of first conductive layers, the fourth verify voltage being larger than the third voltage and smaller than the first voltage, the read pass voltage being larger than the first voltage and smaller than the second program voltage, wherein the semiconductor memory device executes the third verify operation after the execution of the second erase operation and before the execution of the second program operation, and the semiconductor memory device executes the fourth verify operation after the execution of the second program operation.

16. The semiconductor memory device according to claim 15, wherein the semiconductor memory device alternately executes the second erase operation and the third verify operation for multiple times, and the semiconductor memory device alternately executes the second program operation and the fourth verify operation for multiple times.

17. The semiconductor memory device according to claim 10, wherein the semiconductor memory device is configured to execute a third program operation that supplies a third program voltage larger than the write pass voltage to at least a part of the plurality of second conductive layers, and the semiconductor memory device executes the third program operation before the execution of the first erase operation.

* * * * *